(12) United States Patent
Rill et al.

(10) Patent No.: US 11,776,637 B2
(45) Date of Patent: Oct. 3, 2023

(54) VOLTAGE SHARING ACROSS MEMORY DIES IN RESPONSE TO A CHARGE PUMP FAILURE

(71) Applicant: Western Digital Technologies, Inc., San Jose, CA (US)

(72) Inventors: Elliott Rill, San Jose, CA (US); Daniel Linnen, Naperville, IL (US); Kirubakaran Periyannan, Saratoga, CA (US)

(73) Assignee: Western Digital Technologies, Inc., San Jose, CA (US)

(*) Notice: Subject to any disclaimer, the term of this patent is extended or adjusted under 35 U.S.C. 154(b) by 141 days.

(21) Appl. No.: 17/592,237

(22) Filed: Feb. 3, 2022

(65) Prior Publication Data
US 2023/0245705 A1 Aug. 3, 2023

(51) Int. Cl.
G11C 5/14 (2006.01)
G11C 16/30 (2006.01)

(52) U.S. Cl.
CPC .............. *G11C 16/30* (2013.01); *G11C 5/145* (2013.01)

(58) Field of Classification Search
CPC .................................. G11C 16/30; G11C 5/145
See application file for complete search history.

(56) References Cited

U.S. PATENT DOCUMENTS

| 7,085,152 | B2 | 8/2006 | Ellis et al. | |
| 2003/0065994 | A1* | 4/2003 | Kang | H01L 23/544 257/E23.179 |
| 2007/0263442 | A1 | 11/2007 | Cornwell et al. | |
| 2012/0105037 | A1* | 5/2012 | Yen | G11C 5/145 323/282 |
| 2014/0284674 | A1* | 9/2014 | Iwai | G11C 29/702 257/298 |
| 2015/0177995 | A1* | 6/2015 | Camp | G06F 11/1048 711/103 |
| 2021/0082879 | A1* | 3/2021 | Sanuki | H10B 41/27 |

\* cited by examiner

*Primary Examiner* — Khamdan N. Alrobaie
(74) *Attorney, Agent, or Firm* — Armstrong Teasdale LLP

(57) ABSTRACT

A die-to-die voltage sharing process that may be implemented to overcome a charge pump failure on a memory die of a non-volatile storage device. When a charge pump failure is detected, a controller causes another memory die with a functional charge pump to generate and supply a voltage to the memory die with the failed charge pump. When the voltage is received by the memory die with the failed charge pump, the voltage may be used to perform a requested memory operation.

20 Claims, 17 Drawing Sheets

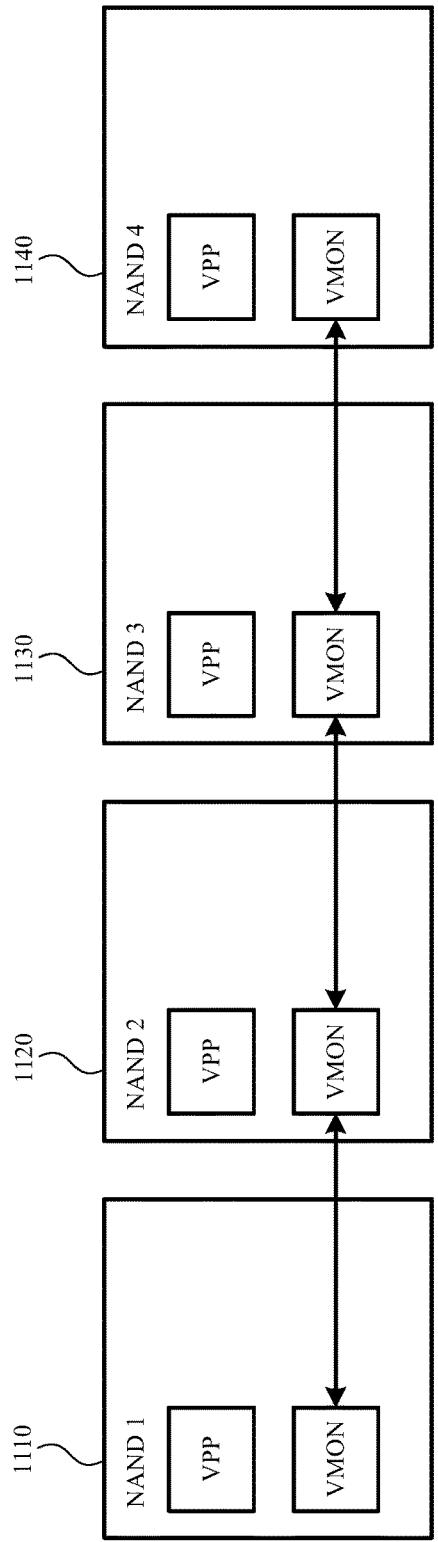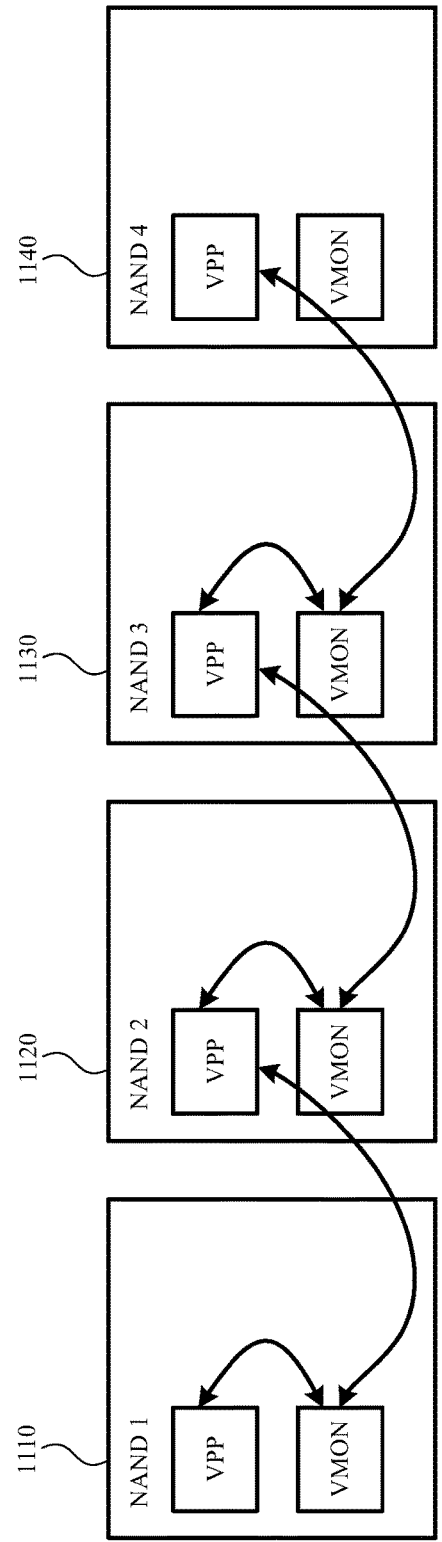
FIG. 11C
FIG. 11D

VOLTAGE SHARING ACROSS MEMORY DIES IN RESPONSE TO A CHARGE PUMP FAILURE

BACKGROUND

A data storage device, such as a non-volatile storage device, typically includes one or more charge pumps (or other voltage generating component) to generate voltages that are used for various data storage operations (e.g., read, write and/or erase operations) performed by the data storage device. If one of the charge pumps fails, data stored by the data storage device may be lost. Additionally, failure of a charge pump may lead to other performance issues. Accordingly, it would be advantageous to be able to provide generated voltages within the storage device as needed to prevent loss of data or other failures.

SUMMARY

Non-volatile storage devices (e.g., NAND flash memory devices) are typically made up of various chips or memory dies that are used to store data. Each memory die includes one or more charge pumps that generate voltages for various read, write and/or erase operations. Failure of one or more of the charge pumps on a memory die prevent the memory die from performing requested memory operations. This may lead to data loss and various performance issues.

In order to address the above, the present application describes a system and method to overcome a charge pump failure on a memory die of a non-volatile storage device. For example, when a charge pump failure is detected, a controller or other processing circuitry associated with the non-volatile storage device causes another memory die, or multiple memory die, with functional charge pumps to generate and supply a voltage to the memory die with the failed (or failing) charge pump. When the voltage is received by the memory die with the failed charge pump, the voltage may be used to perform a requested memory operation. In an example, the solution described herein may be used as a temporary solution (e.g., to recover data stored on the memory die) and/or to restore functionality to the memory die on a long-term basis.

Accordingly, the present application describes a method for sharing voltages across various NAND dies of a non-volatile storage device. In an example, the method includes detecting a failure of a charge pump on a first NAND die. In response to detecting the failure, a second NAND die that is electrically coupled to the first NAND die is identified. Instructions are provided to the second NAND die that causes the second NAND die to generate a voltage for, and provide the voltage to, the first NAND die. Additionally, instructions are provided to the first NAND die that causes the first NAND die to accept the voltage from the second NAND die. In response to receiving the voltage, the first NAND die performs a memory operation using the received voltage from the second NAND die.

The present application also describes a storage device comprising a non-volatile storage unit and a controller. The non-volatile storage unit includes a first memory die and a second memory die. In an example, the first memory die includes a charge pump and the second memory die includes a charge pump. The controller is communicatively coupled to the non-volatile storage unit and is configured to detect a failure of the charge pump on the first memory die. Based on the controller detecting the failure of the charge pump of the first memory die, the controller causes the charge pump of the second memory die to generate a voltage for the first memory die and subsequently cause the generated voltage to be provided to the first memory die. Based on receiving the voltage, the first memory die may perform a memory operation.

Also described is a storage device having a non-volatile storage unit. The non-volatile storage unit includes a first memory die electrically coupled to a second memory die. Each of the first memory die and the second memory die include a means for generating a voltage. The non-volatile storage unit also includes a means for detecting a voltage failure on the first memory die and a means for causing the voltage generating means on the second memory die to generate a voltage for the first memory die. The non-volatile storage unit also includes a means for causing the second memory die to provide the generated voltage to the first memory die.

This summary is provided to introduce a selection of concepts in a simplified form that are further described below in the Detailed Description. This summary is not intended to identify key features or essential features of the claimed subject matter, nor is it intended to be used to limit the scope of the claimed subject matter.

BRIEF DESCRIPTION OF THE DRAWINGS

Non-limiting and non-exhaustive examples are described with reference to the following Figures.

FIG. 11C illustrates a third arrangement of NAND dies that are bonded together according to an example.

FIG. 11D illustrates a fourth arrangement of NAND dies that are bonded together according to an example.

DETAILED DESCRIPTION

Figure 1:
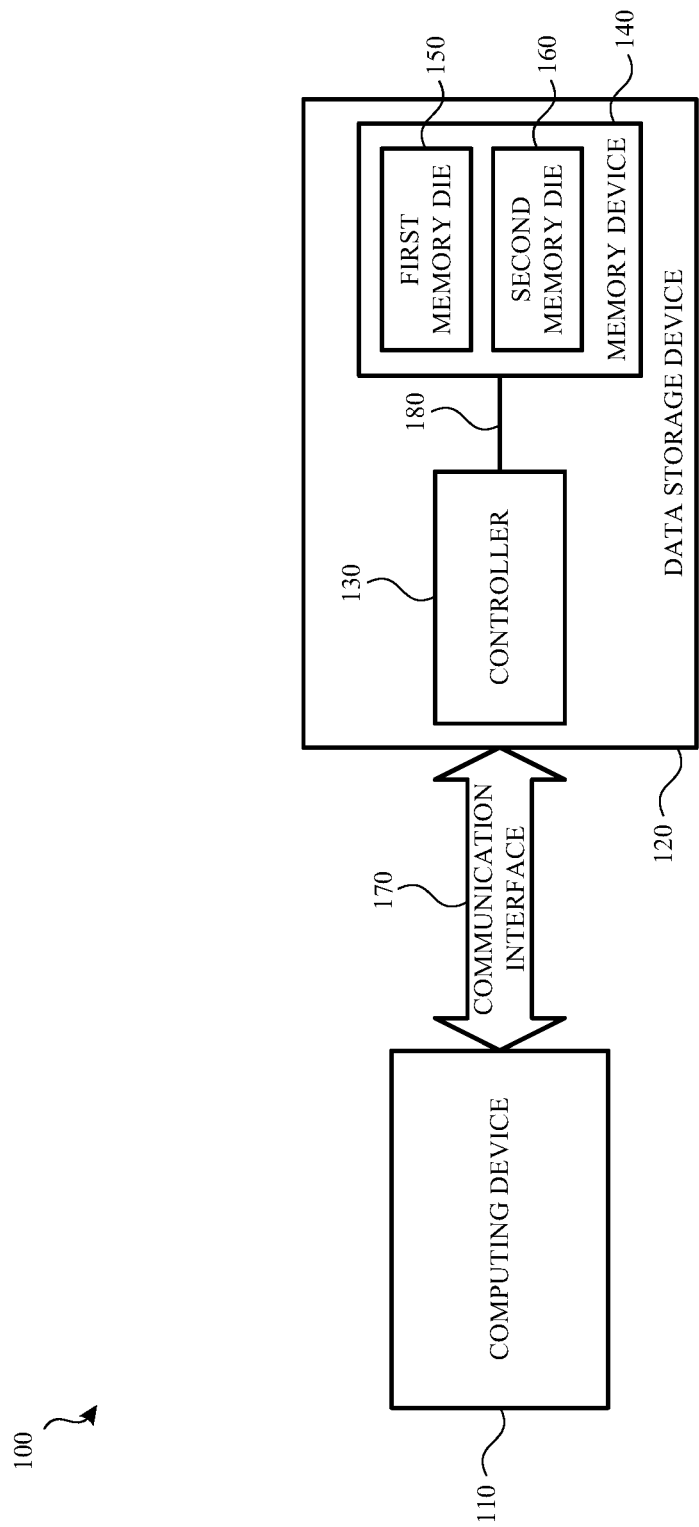
FIG. 1 is a block diagram of a data storage system according to an example.

In the following detailed description, references are made to the accompanying drawings that form a part hereof, and in which are shown by way of illustrations specific embodiments or examples. These aspects may be combined, other aspects may be utilized, and structural changes may be made without departing from the present disclosure. Examples may be practiced as methods, systems or devices. Accordingly, examples may take the form of a hardware implementation, an entirely software implementation, or an implementation combining software and hardware aspects. The following detailed description is therefore not to be taken in a limiting sense, and the scope of the present disclosure is defined by the appended claims and their equivalents.

As indicated above, non-volatile storage devices, such as, for example, NAND flash memory devices, typically include one or more memory dies that are used to store data. Each memory die includes one or more charge pumps that generate voltages for various memory operations (e.g., read, write and erase operations). As memory die layouts become more complex, space on the memory die is limited. In some cases, charge pumps on the memory die are a point of failure due, at least in part, to the space constraints. In other cases, capacitors within the charge pumps are susceptible to failure or breakdown because of high electric fields that are generated by the charge pumps.

Failure of one or more of the charge pumps on a memory die typically means that the memory die is no longer functional. As a result, data may be lost, the memory die can no longer be used, and the non-volatile storage device as a whole may suffer performance degradation.

In order to address the above, the present application describes a data storage device (also referred to herein as a data storage unit) in which charge pumps from various memory dies of the data storage device are bonded, electrically connected or otherwise coupled such that a voltage generated from a charge pump on a functional memory die is provided to another memory die with a failed charge pump. When the memory die with the failed charge pump receives the generated voltage from the functional memory die, the memory die with the failed charge pump may perform a read operation (or other memory operation) to recover data from an associated memory array or other storage circuitry thereby helping ensure that data is not lost.

In the examples described herein, the memory dies of the data storage device may include various modes or operating states that enables the generation, sharing and acceptance of generated voltages. For example, each memory die of the data storage device may include an operating state or mode whereby if a failure (e.g., a charge pump failure, a short, a voltage drop) is detected, a controller of the data storage device causes the failing memory die to enter a voltage acceptance mode. While in the voltage acceptance mode, the failing memory die can accept an external voltage in place of an internally generated voltage (e.g., a voltage generated by its own charge pump) via a bond pad or other connection mechanism associated with the failing memory die. The failing memory die may also use the external voltage to supplement its own internally generated voltage.

Likewise, each memory die of the data storage device may include an operating state or mode whereby the memory die enters a voltage output mode that causes the memory die to generate and output a voltage to a bond pad or other connection mechanism associated with the functional memory die. In an example, the bond pad associated with the functional memory die is electrically connected (e.g., via a bond wire) to the bond pad associated with the failing memory die.

The controller or other processing circuitry associated with the data storage device synchronizes the voltage acceptance mode and the voltage output mode of the memory dies in response to a detected failure. Thus, the die-to-die voltage sharing may be efficient as possible.

Although the examples above discuss die-to-die voltage sharing in response to a charge pump failure, the die-to-die voltage sharing may be used in response to a number of detected issues including, but not limited to, shorts (e.g., a short in a circuit of the die), voltage drops or other memory array defects and the like. In addition, the die-to-die voltage sharing is not limited to sharing between a single functional memory die and a single failing memory die. In some examples, a single functional memory die may generate and provide a voltage for multiple failing memory dies. In yet another example, multiple functional memory dies may generate voltages for, and provide voltages to, a single failing memory die, or multiple failing memory dies.

In some examples, the die-to-die voltage sharing disclosed herein may be implemented until a memory operation is complete. For example and as briefly described above, when the memory die with the failed charge pump receives a generated voltage from another memory die, the memory die with the failed charge pump (or other detected issue) may perform a read operation (or other memory operation) to recover data. Once the data is recovered and stored in another storage location, the memory die may be flagged as inoperable by the controller.

In another example, the die-to-die voltage sharing may be used to restore functionality to the failing memory die for a set period of time or indefinitely. For example, the controller of the data storage device (or other processing circuitry associated with the data storage device) may cause one or more functional memory dies to continue generating and providing a voltage for the failing memory die for any given amount of time. Likewise, the controller may cause the failing memory die to continue to accept and use voltage from the one or more functional memory dies.

Additionally, while the examples of the present disclosure describe a charge pump from a functional memory die providing a voltage to a failing or non-functional memory die, the present application is not so limited. In examples, a controller or other processing circuitry associated with the data storage device may cause the failing memory die to receive and/or utilize external voltages from a number of available sources on or otherwise associated with the data storage device. These include, but are not limited to, voltage rails and/or boosted voltages for hold-up capacitors. Likewise, the failing memory die may supplement a received voltage with an additional voltage using its own functional circuitry (e.g., functional charge pumps).

Accordingly, the present application describes a number of technical benefits for data storage devices. These include, but are not limited to, increasing the reliability of memory dies of a data storage device with respect to chip-level failures, increasing the reliability of the data storage device, and helping prevent data loss and/or corruption due to charge pump failures, shorts, and/or voltage drops. Thus, unlike conventional memory dies, in which a failure (such as those described herein) would lead to data loss and ultimately cause the memory dies to be non-operational, the examples of the present disclosure help ensure that data on a failed memory die is not lost. Additionally, the die-to-die voltage sharing process described herein may be used to at least partially rehabilitate the failed memory die.

These various benefits and examples will be described in greater detail below with reference to FIG. 1-FIG. 11D.

FIG. 1 illustrates an example data storage system 100. The data storage system 100 includes a computing device 110 and a data storage device 120. The data storage device 120 may be part of or otherwise integrated with the computing device 110. In another example, the data storage device 120 may be separate from, or otherwise external to, the computing device 110. The data storage device 120 may be any type of data storage device, drive, module, component, and/or system. For example, the data storage device 120 may be a hybrid hard drive, a solid-state drive, a hard disk drive, and so on.

The data storage device 120 may include a controller 130. In an example, the controller 130 includes control circuitry, processing circuitry, software, firmware, or a combination thereof. For example, the controller 130 may include one or more processors, memory devices, data and or power transmission channels/paths, boards, and the like in order to perform the various functions and features described herein.

The controller 130 may be implemented as a system-on-a-chip (SoC), a field-programmable gate array (FPGA), an application-specific integrated circuit (ASIC), and the like. In another example, the controller 130 (or various components of the controller 130) may be mounted on a printed circuit board (PCB). The controller 130 may be configured to receive and/or send various commands. For example, the controller 130 may receive, execute and/or send various commands (e.g., read, write, and/or erase commands) in order to perform aspects of the various examples described herein. The controller 130 may also cause the implementation of a die-to-die voltage sharing process such as described herein.

The data storage device 120 may also include a memory device 140 (e.g. volatile and/or non-volatile memory). The memory device 140 (and/or portions of the memory device 140) may also be referred to as a storage medium. The memory device 140 includes a number of storage elements. In an example, each storage element is a chip or a memory die that is used to store data. In the example shown, the memory device 140 includes a first memory die 150 and a second memory die 160. In an example, the first memory die 150 and the second memory die 160 include non-volatile memory elements such as, for example, NAND flash memory elements and/or NOR flash memory elements. Although two memory dies are shown, the memory device 140 may include any number of storage elements. For example, the storage elements may take the form of solid-state memory such as, for example, 2D NAND, 3D NAND memory, multi-level cell memory, triple level cell memory, quad-level cell memory or any combination thereof.

The controller 130 may communicate with the computing device 110 via a communication interface 170. The communication interface 170 may include hardware such as, for example, wires, pins, traces, connectors, software, firmware, or a combination thereof. Example communication interfaces 170 include a peripheral component interconnect express (PCIe) bus, a serial AT attachment (SATA) bus, and a non-volatile memory express (NVMe) bus.

The communication interface 170 is used to transmit various commands between the computing device 110 and the controller 130. The commands may include data access commands, data storage commands and the like. For example, the controller 130 may receive commands from the computing device 110 and execute the commands on the memory device 140. The controller 130 may be coupled to the memory device 140 via an interface 150 (e.g., one or more lines, pins, wires, traces). In an example, each channel of the interface 150 may be coupled to different portions of the memory device 140.

Figure 2:
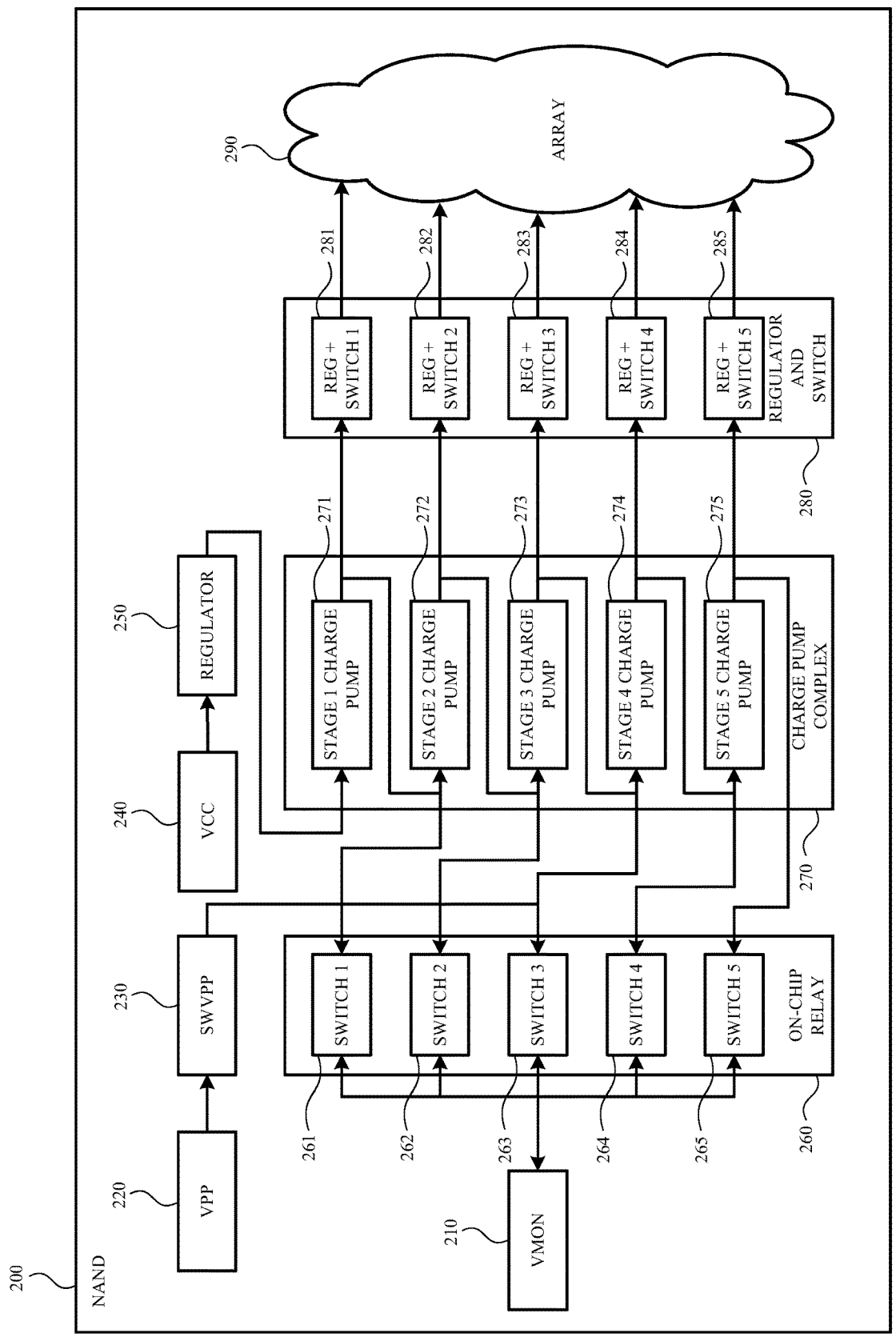
FIG. 2 is a block diagram of a NAND die according to an example.

FIG. 2 is a block diagram of a NAND die 200 according to an example. Although a NAND die 200 is specifically shown and described, the various features disclosed herein may be implemented in and/or by any volatile or non-volatile computer memory chip and/or memory die.

In an example, the NAND die 200 includes a high voltage input/output (e.g., VMON) pad 210. The voltage input/output pad 210 may be used to provide a voltage to the various circuits and components on the NAND die 200. For example, the voltage input/output pad 210 may receive a generated voltage (e.g., a voltage generated from another NAND die) and/or a system-level voltage (e.g., a voltage provided by a voltage rail). In another example, the voltage input/output pad 210 may be used to provide a generated voltage to a failing memory die during a die-to-die voltage sharing process.

The voltage input/output pad 210 may be electrically coupled to an on-chip relay 260 that includes a number of switches. For example, the on-chip relay 260 includes five switches: switch 1 261, switch 2 262, switch 3 263, switch 4 264, and switch 5 265. Although five switches are shown and described, the on-chip relay 260 of the NAND die 200 may include any number of switches.

Each switch of the on-chip relay 260 is electrically coupled to one or more stages of a charge pump of a charge pump complex 270. The switches enable a voltage to be provided as an input to the various charge pump stages of the charge pump complex 270. Additionally, the switches enable the various stages of the charge pump to generate and provide a voltage to an external source (e.g., a failing memory die) during a die-to-die voltage sharing process.

For example, switch 1 261 may be electrically coupled to the output of the stage 1 charge pump 271 of the charge pump complex 270 and electrically coupled to the input of the stage 2 charge pump 272 of the charge pump complex 270; switch 2 262 may be electrically coupled to the output of the stage 2 charge pump 272 of the charge pump complex 270 and electrically coupled to the input of the stage 3 charge pump 273 of the charge pump complex 270; switch 3 263 may be electrically coupled to the output of the stage 3 charge pump 273 of the charge pump complex 270 and electrically coupled to the input of the stage 4 charge pump 274 of the charge pump complex 270; switch 4 264 may be electrically coupled to the output of the stage 4 charge pump 274 of the charge pump complex 270 and electrically coupled to the input of the stage 5 charge pump 275 of the charge pump complex 270; and switch 5 may be electrically coupled to the output of the stage 5 charge pump 275 of the charge pump complex 270 and to a regulator and/or switch (e.g., a regulator and switch 5 285) of a regulator and switch complex 280.

The NAND die 200 also includes a voltage input pad (e.g., VPP) 220. The voltage input pad 220 may be electrically coupled to a voltage input switch (e.g., SWVPP) 230. The voltage input switch 230 enables a voltage generated or otherwise provided by the voltage input pad 220 to be input to a charge pump complex 270 of the NAND die 200. For example, a voltage generated at or otherwise received by the voltage input pad 220 may be provided as an input of the stage 2 charge pump 272 of the charge pump complex 270, as an input to the stage 3 charge pump 273 of the charge pump complex 270 and/or as an input to the stage 4 charge pump 274 of the charge pump complex 270. Although specific charge pump complexes are shown and described, the voltage input switch 230 may be used to provide a voltage to any stage of the charge pump complex 270.

In an example, the NAND die 200 also includes a power input (e.g., VCC) 240 and an associated regulator 250. The power input 240 and its associated regulator 250 may generate and/or cause the NAND die 200 to generate an initial internal voltage. Once the initial internal voltage is generated, the voltage is provided to the stage 1 charge pump 271 of the charge pump complex 270.

As shown in FIG. 2, each stage of the charge pump complex 270 is connected in series. For example, the output of the stage 1 charge pump 271 is connected to the input of the stage 2 charge pump 272. Likewise, the output of the stage 2 charge pump 272 is connected to an input of the stage 3 charge pump 273 and so on. Each stage of the charge pump complex 270 is configured to increase a received voltage by a determined amount until a target voltage (e.g., a voltage requested or otherwise required to complete a downstream memory operation) is reached or is otherwise available.

For example, a voltage may be generated or otherwise provided from the power input 240, via the regulator 250, to the stage 1 charge pump 271 of the charge pump complex 270. A controller (e.g., controller 130 (FIG. 1)) or other processing circuitry associated with the NAND die 200 may cause the stage 1 charge pump 271 of the charge pump complex 270 to provide the voltage to the stage 2 charge pump 272 of the charge pump complex 270. When the voltage is received by stage 2 charge pump 272 of the charge pump complex 270, the voltage is increased.

If the target voltage is reached, the voltage may be provided to an array 290 of the NAND die (or other downstream circuits) such that a memory operation (e.g., a read operation, a write operation, an erase operation) may be performed. If the target voltage has not been reached, the controller may cause the stage 2 charge pump 272 of the charge pump complex 270 to provide the voltage to the input of the stage 3 charge pump 273 of the charge pump complex 270 to increase the voltage. This may repeat until the desired voltage is available.

The NAND die 200 may also include a regulator and switch complex 280 that includes a number of regulators and switches. Each regulator and switch of the regulator and switch complex 280 may be electrically coupled to an output of a respective stage of the charge pump complex 270. For example, the output of the stage 1 charge pump 271 of the charge pump complex 270 may be electrically coupled to a regulator and switch 1 281 of the regulator and switch complex 280; the output of the stage 2 charge pump 272 of the charge pump complex 270 may be electrically coupled to a regulator and switch 2 282 of the regulator and switch complex 280; the output of the stage 3 charge pump 273 of the charge pump complex 270 may be electrically coupled to a regulator and switch 3 283 of the regulator and switch complex 280; the output of the stage 4 charge pump 274 of the charge pump complex 270 may be electrically coupled to a regulator and switch 4 284 of the regulator and switch complex 280; and the output of the stage 5 charge pump 275 of the charge pump complex 270 may be electrically coupled to a regulator and switch 5 285 of the regulator and switch complex 280. Each regulator and switch of the regulator and switch complex 280 may be configured to regulate a received voltage and/or pass the received voltage to the array 290 (or other downstream circuitry) of the NAND die 200 to enable performance of a memory operation.

As discussed, in conventional NAND die technology, if one or more stages of a charge pump complex of the NAND die were to fail and/or if the NAND die has a short or other such issue, data stored by the NAND die would be lost. Additionally, the failing NAND die would be useless. However, to overcome the above issues, the NAND die 200 of the present application enables die-to-die voltage sharing between a functional memory die and the failing memory die. The die-to-die voltage sharing process may be used to recover data from the failed NAND die and/or may be used to restore functionality to the failed NAND die.

Figure 3A:
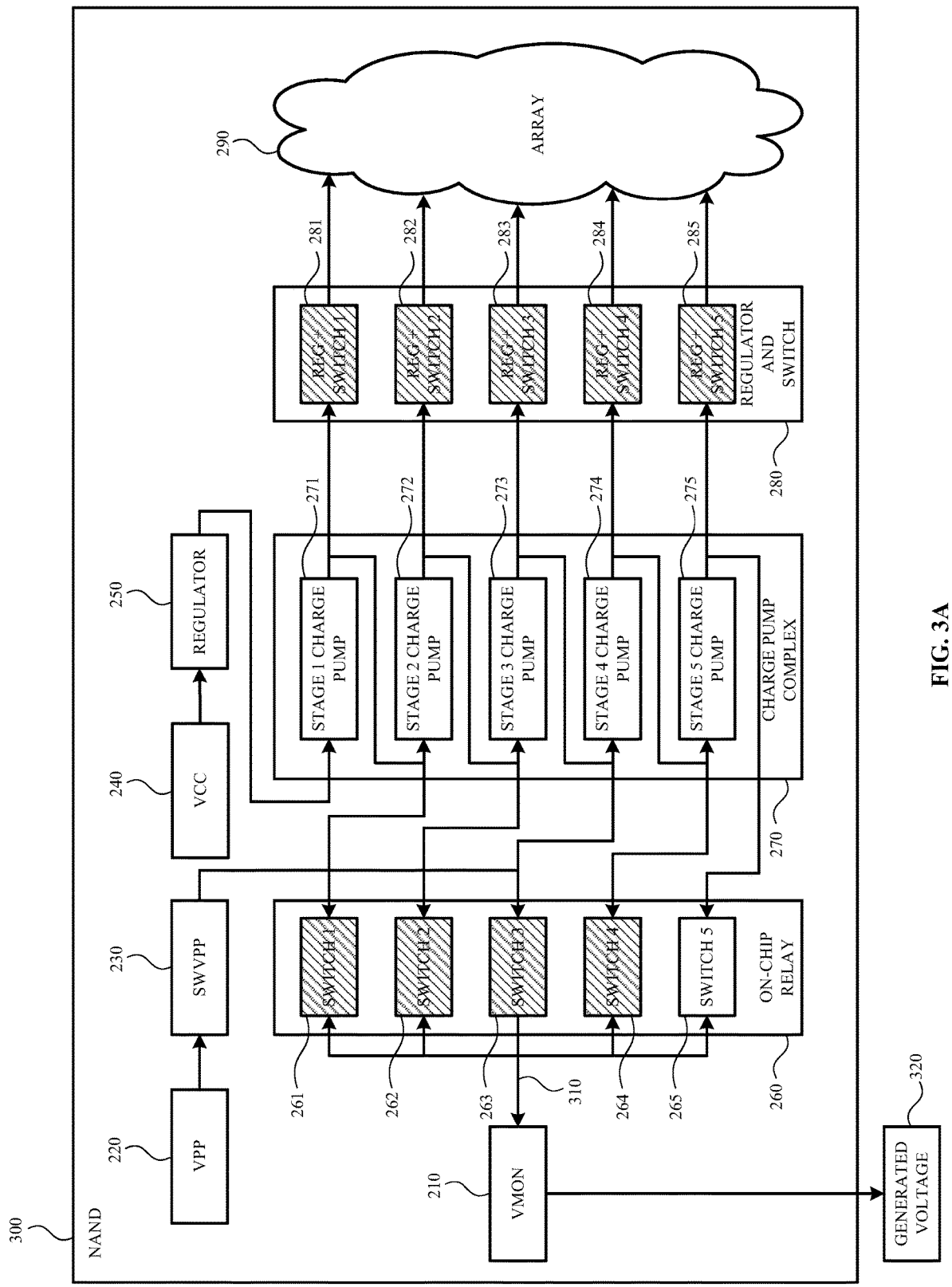
FIG. 3A illustrates a functional NAND die that generates a voltage for a failing NAND die according to an example.

FIG. 3A illustrates a functional NAND die 300 generating a voltage for a failing NAND die (e.g., failing NAND die 400 (FIG. 4A)) according to an example. The functional NAND die 300 may be similar to the NAND die 200 shown and described with respect to FIG. 2. As such, the reference numbers for the circuitry of the functional NAND die 300 remain consistent with the reference numbers of the circuitry of the NAND die 200 for purposes of clarity.

In the example shown in FIG. 3A, a controller (e.g., controller 130 (FIG. 1)) or other processing circuitry may detect or otherwise determine that a particular NAND die in a data storage device (e.g., data storage device 120 (FIG. 1)) is failing or has failed. Detection of a failing memory die will be described in more detail below with respect to FIG. 7.

In response to a detection of a failure or other such issue, the controller determines or otherwise identifies that the functional NAND die 300 is electrically coupled to the failing NAND die. As such, the controller may determine that the functional NAND die 300 may supply a required voltage to the failing NAND die so the failing NAND die may remain functional—at least until data stored by the failing NAND die is recovered.

The controller may also determine a voltage (represented as generated voltage 320) that is needed to enable the failing NAND die to complete a memory operation and/or to continue functioning. In the example shown in FIG. 3A, the controller determines that the failing NAND die requires a high voltage (e.g., thirty or more volts). As such, the controller instructs the functional NAND die 300 enter a voltage output mode and generate a high voltage (e.g., generated voltage 320) to the failing NAND die.

In order to generate the required voltage, the power input 240 of the functional NAND die 300 provides a first voltage, via the regulator 250, to an input of the stage 1 charge pump 271 of the charge pump complex 270. The voltage is subsequently passed to an input of the stage 2 charge pump 272, an input of the stage 3 charge pump 273, an input of the stage 4 charge pump 274, and an input to the stage 5 charge pump 275 of the charge pump complex 270. As indicated above, as the voltage is passed to each stage in the charge pump complex 270, the voltage increases.

Switch 5 265 of the on-chip relay 260 of the functional NAND die 300 is activated. Since switch 5 265 is connected to the output of the stage 5 charge pump 275 of the charge pump complex 270, the generated voltage may be provided (represented by the arrow 310) to the input/output pad 210 of the functional NAND die 300.

As will be explained in greater detail below, the input/output pad 210 of the functional NAND die 300 may be electrically coupled (e.g., via a bond wire) to an input/output pad and/or a voltage input pad of the failing NAND die. Once generated and provided to the input/output pad 210 of the functional NAND die 300, the generated voltage 320 may be provided to, and accepted by, the failing NAND die.

In the example shown in FIG. 3A, some of the circuitry of the functional NAND die 300 may be in an inactive state when the voltage is generated and subsequently provided to the failing NAND die. For example, switch 1 261 through switch 4 264 may not need to be activated in order to generate and provide the requested voltage. Additionally, since the functional NAND die 300 is operating in a voltage output mode, the generated voltage will not be utilized by the functional NAND die 300. As such, the regulators and switches of the regulator and switch complex 280 may also be in an inactive state.

Figure 3B:
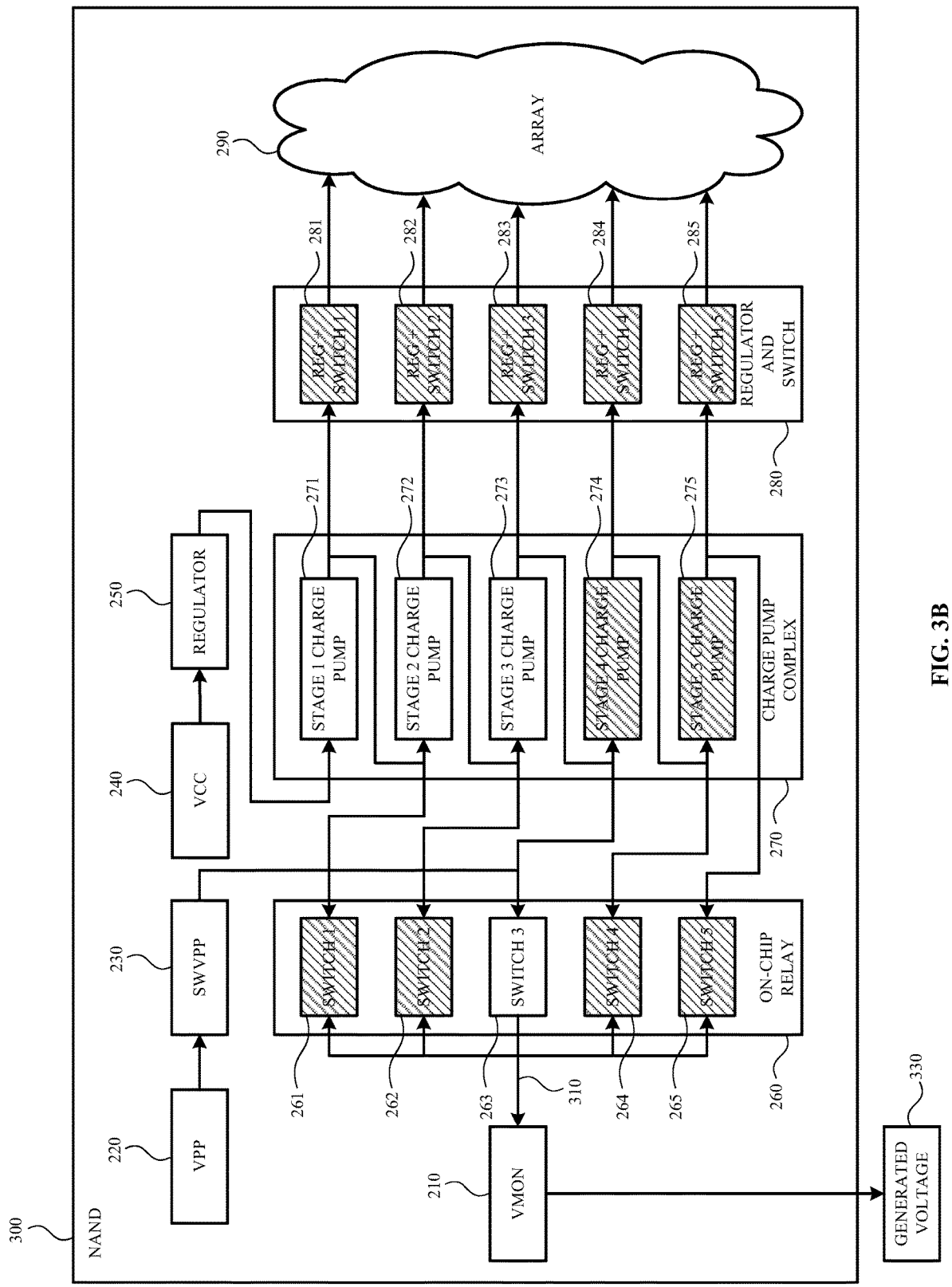
FIG. 3B illustrates the functional NAND die of FIG. 3A generating a different voltage for a failing NAND die according to an example.

FIG. 3B illustrates the functional NAND die 300 of FIG. 3A generating a different (e.g., lower) voltage (represented as generated voltage 330) for a failing NAND die (e.g., failing NAND die 400 (FIG. 4A)) according to an example.

In this example, the controller may determine that the failing NAND die requires twelve volts to complete a memory operation or to otherwise remain functional. As such, the controller may cause the functional NAND die 300 to enter the voltage output mode and activate the stage 1 charge pump 271, the stage 2 charge pump 272 and the stage 3 charge pump 273 of the charge pump complex 270 in order to generate twelve volts. Based on the voltage being generated, switch 3 263 (that is electrically coupled to the output of the stage 3 charge pump 273 of the charge pump complex 270) is activated. The generated voltage 330 is then provided (represented by the arrow 310) to the input/output pad 210 of the functional NAND die 300. The generated voltage 330 may then be provided to an input/output pad and/or a voltage input pad of the failing NAND die such as described herein.

In an example, the controller may request that the generated voltage be elevated. Voltage elevation may be used to overcome various switches in the paths between the circuitry of the functional NAND die 300 and/or the failed NAND die. For example, the switches may be transistors that cause voltage drops. In some examples, the controller may determine or otherwise calculate the voltage drop and instruct the functional NAND die 300 to generate a voltage that takes the voltage drops into account.

Figure 4A:
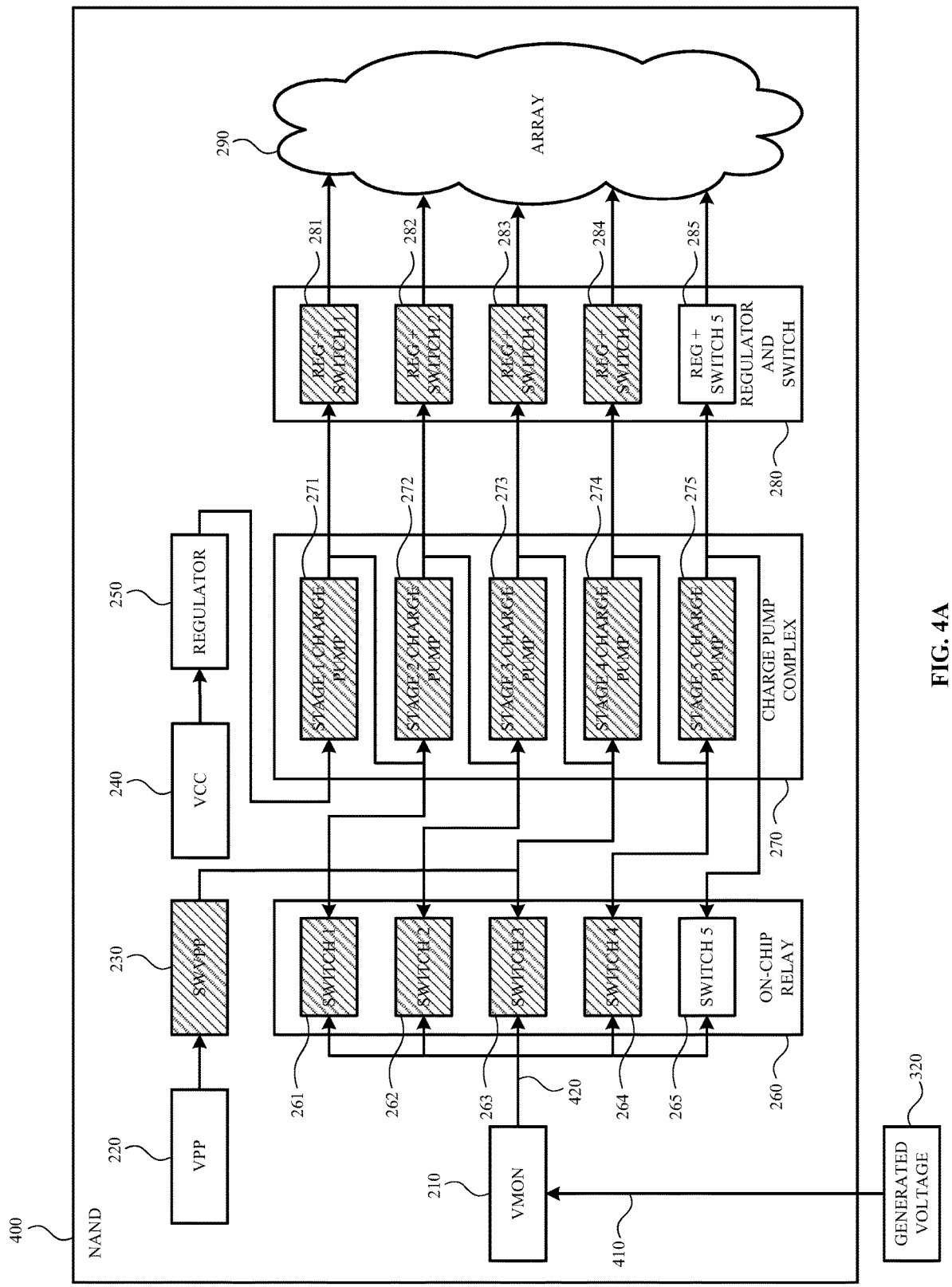
FIG. 4A illustrates a failing (or failed) NAND die that receives a generated voltage from a functional NAND die according to an example.

FIG. 4A illustrates a failing (or failed) NAND die 400 that receives a generated voltage 320 from a functional NAND die (e.g., functional NAND die 300 (FIG. 3A)) according to an example. The failing NAND die 400 may be similar to the NAND die 200 shown and described with respect to FIG. 2. As such, the reference numbers for the circuitry of the failing NAND die 400 remain consistent with the reference numbers of the circuitry of the NAND die 200 for purposes of clarity.

As shown in FIG. 4A, the failing NAND die 400 receives a generated voltage 320 from the functional NAND die 300 (FIG. 3A). In an example, the voltage input/output pad 210 of the failing NAND die 400 is electrically coupled (e.g., via a bond wire) with the voltage input/output pad 210 of the functional NAND die 300. In such an example, the generated voltage 320 is taken as an input to the voltage input/output pad 210 of the failing NAND 400 die (represented by the arrow 410). As discussed above, a controller (e.g., controller 130 (FIG. 1)) associated or otherwise in communication with the failing NAND die 400 causes the failing NAND die 400 to enter a voltage acceptance mode or otherwise causes the failing NAND die 400 to accept the generated voltage 320 from the functional NAND die 300.

In response to receiving the generated voltage 320 and/or in response to a command provided by the controller, the failing NAND die 400 activates switch 5 265 and the generated voltage is provided (represented by the arrow 420) to switch 5 265. As discussed above, the output of switch 5 265 is electrically coupled to the output of the stage 5 charge pump 275 of the charge pump complex 270 and/or to the regulator and switch 5 285 of the regulator and switch complex 280. Accordingly, the generated voltage 320 may be provided to the array 290 to enable performance of a memory operation.

In an example, the memory operation may be a read operation in order to recover data that is stored in the array 290. Once the data is read, the data may be provided to and/or stored on another NAND die. Although a read operation is specifically mentioned, the generated voltage 320 may be used to perform other memory operations and/or commands.

As discussed above, the controller may cause the failing NAND die 400 to enter a voltage acceptance mode. While in this mode, the failing NAND die 400 expects to receive an external voltage. As such, various stages of the charge pump complex 270 of the failing NAND die 400 may not be activated or otherwise used to generate an internal voltage. Likewise, unused and/or unneeded switches on the on-chip relay 260 and/or the regulator and switch complex 280 may also remain in an inactive state.

In an example, the failing NAND die 400 may use its own circuitry to generate an internal voltage to supplement a received voltage. However, in order to implement the example that follows, the controller and/or the failing NAND die 400 may need to determine or otherwise identify which charge pumps in the charge pump complex 270 of the failing NAND die 400 are functional. Determining the functionality of the charge pumps in a charge pump complex 270 is described in greater detail below with respect to FIG. 7.

Figure 4B:
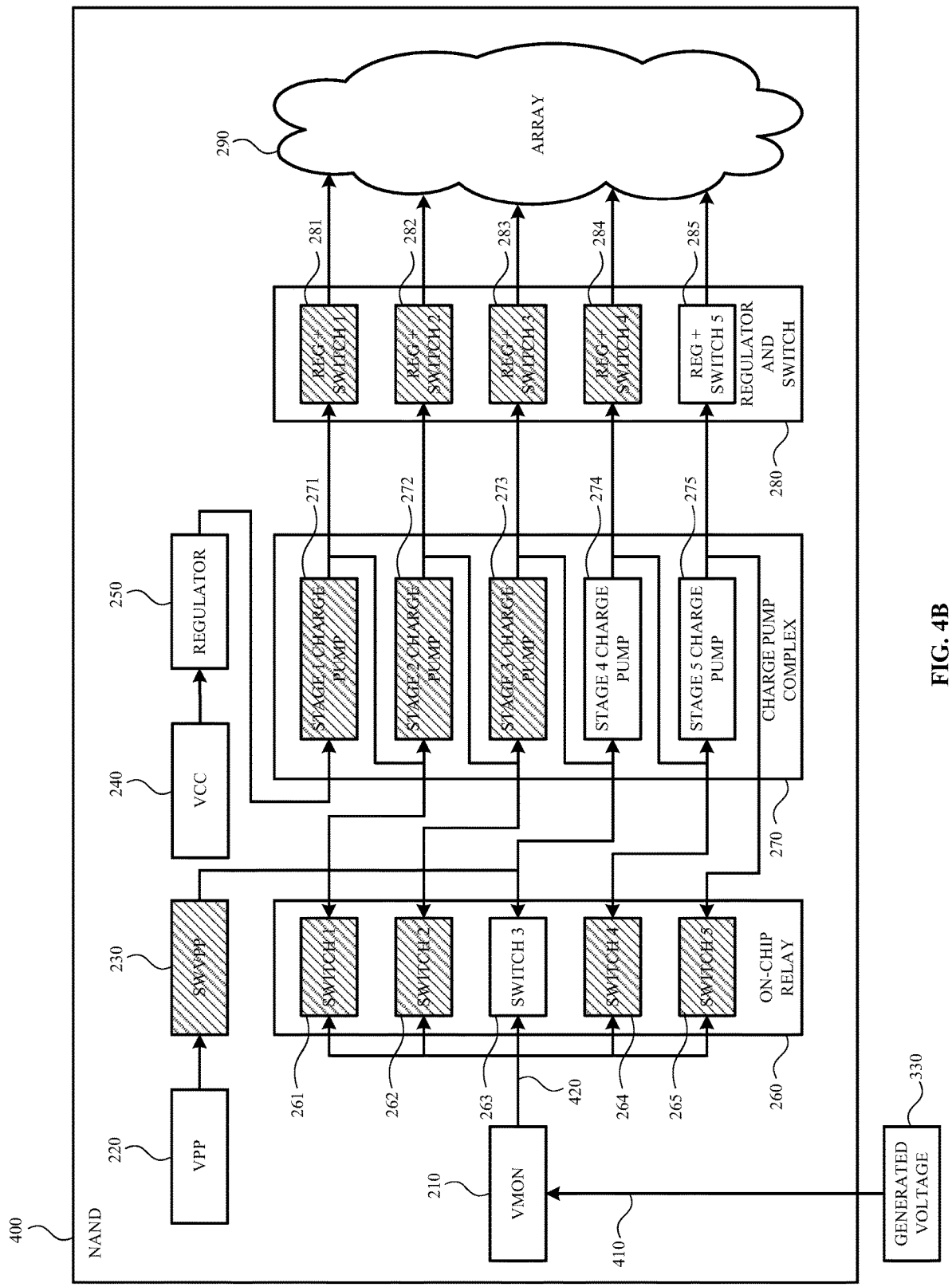
FIG. 4B illustrates how the failing NAND die of FIG. 4A may supplement a received voltage using its own circuitry according to an example.

FIG. 4B illustrates how a failing NAND die 400 may supplement a received voltage by generating an internal voltage using its own circuitry according to an example. The failing NAND die 400 may receive a generated voltage 330 from the functional NAND die 300 via a bond wire or other electrical connection such as described above.

In this example, the generated voltage 330 is lower than is needed to perform a memory operation. However, the memory operation to be performed on the failing NAND die 400 may require thirty (or more) volts.

In order to generate the additional voltage, the failing NAND die 400 receives the generated voltage 330 (e.g., via its voltage input/output pad 210) and causes activation of switch 3 263. Switch 3 263 provides the generated voltage 330 as an input to the stage 4 charge pump 274 of the charge pump complex 270. The stage 4 charge pump 274 increases the voltage of the generated voltage 330. The increased voltage is then provided to an input of the stage 5 charge pump 275 of the charge pump complex 270. The voltage is increased again and subsequently provided to the regulator and switch 5 285 of the regulator and switch complex 280.

In this example, the charge pumps of the failing NAND die 400 increased the generated voltage 330 from the received voltage to the needed thirty (or more volts). The voltage may then be used to perform a memory operation on the array 290 and/or may be provided to other downstream circuitry.

Figure 5:
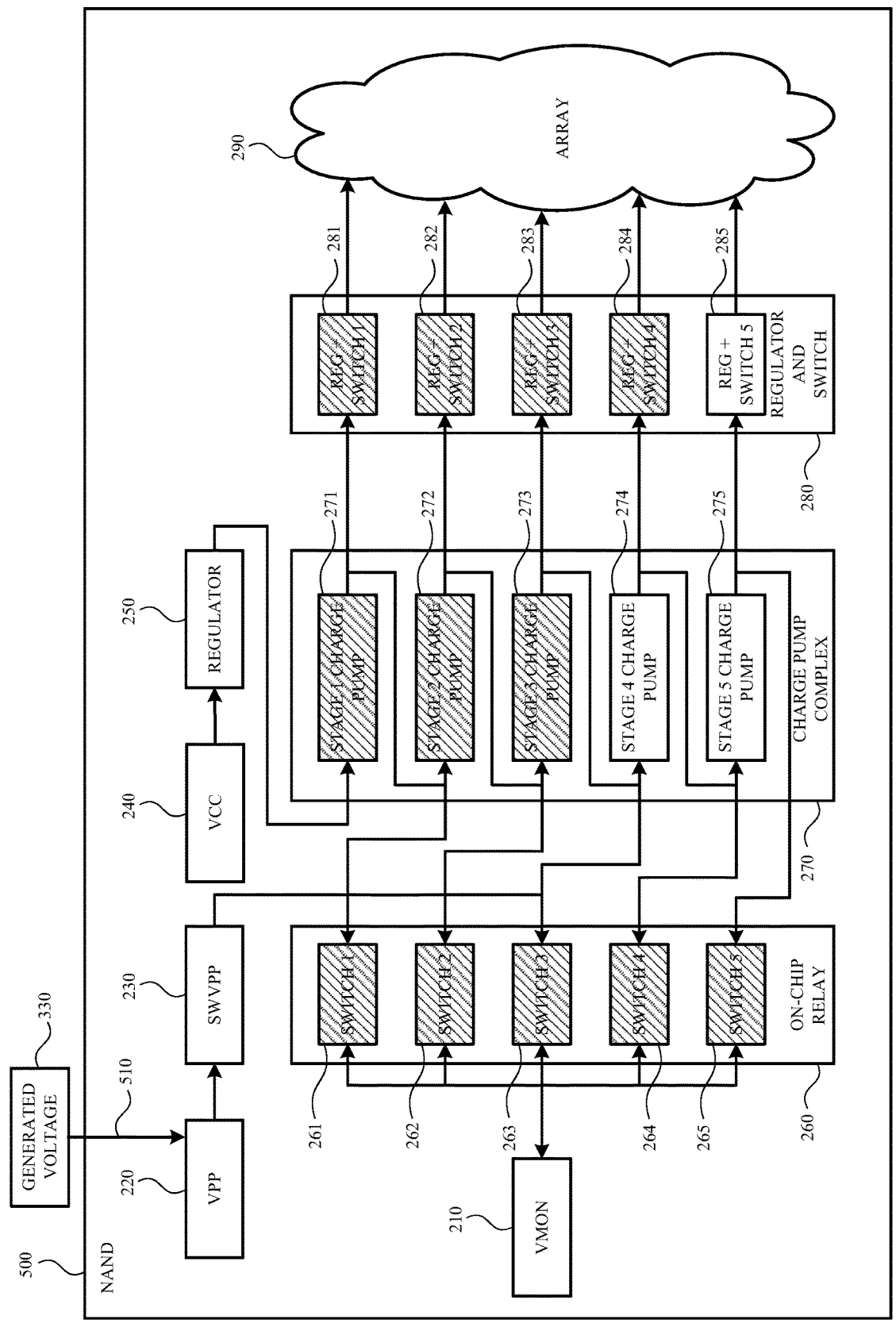
FIG. 5 illustrates a failing (or failed) NAND die that receives a generated voltage from a functional NAND die according to an example.

FIG. 5 illustrates a failing (or failed) NAND die 500 receiving a generated voltage 330 from a functional NAND die (e.g., functional NAND die 300 (FIG. 3B)) according to an example. The failing NAND die 500 may be similar to the NAND die 200 shown and described with respect to FIG. 2. As such, the reference numbers for the circuitry of the failing NAND die 500 remain consistent with the reference numbers of the circuitry of the NAND die 200 for purposes of clarity.

As shown in FIG. 5, the failing NAND die 500 receives the generated voltage 330 from the functional NAND die 300. However, in this example, the generated voltage 330 is received as an input (represented by the arrow 510) to the voltage input pad 220 of the failing NAND die 500 instead of the voltage input/output pad 210 as in previous examples. In this example, the generated voltage 330 is received by the voltage input pad 220 of the failing NAND die 500 because the voltage input pad 220 of the failing NAND die 500 is electrically coupled to the voltage input/output pad 210 of the functional NAND die 300 via, for example, a bond wire.

When the generated voltage 330 is received by the voltage input pad 220 of the failing NAND die 500, the voltage input switch 230 is activated. The voltage input switch 230 may then provide the generated voltage 330 to the input of the stage 4 charge pump 274 of the charge pump complex 270 of the failing NAND die 500 such as described above with respect to FIG. 4B.

Figure 6A:
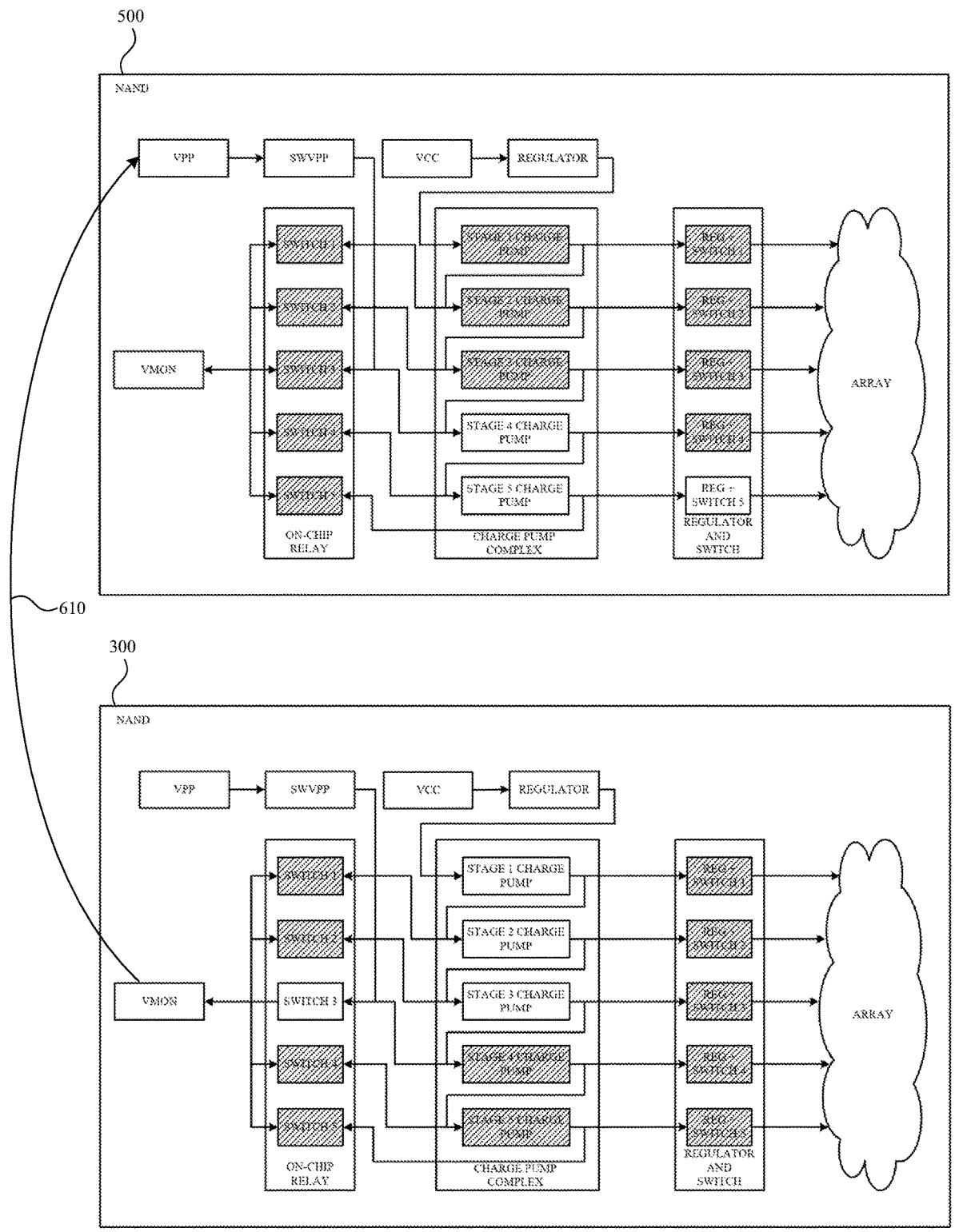
FIG. 6A illustrates a bond wire electrically coupling a voltage input/output pad of a functional NAND die to a voltage input pad of a failing NAND die according to an example.

FIG. 6A illustrates a bond wire (represented by the arrow 610) or other coupling mechanism electrically coupling a voltage input/output pad of a functional NAND die (e.g., functional NAND die 300 (FIG. 3B)) to a voltage input pad of the failing NAND die (e.g., failing NAND die 500 (FIG. 5)). As discussed above with respect to FIG. 3B and FIG. 5, a voltage generated by the stage 1 charge pump, the stage 2 charge pump and the stage 3 charge pump of the pump complex of the functional NAND die 300 may be provided as an input to the voltage input pad of the failing NAND die 500.

In an example, the voltage is provided from the functional NAND die 300 to the failing NAND die 500 in response to a defect detected in a charge pump (e.g., the stage 2 charge pump) of the failing NAND die 500. As explained above, upon receiving the voltage from the functional NAND die 300, the voltage input switch of the failing NAND die 500 may provide the voltage to a functional charge pump (e.g., the stage 4 charge pump and/or the stage 5 charge pump) to increase the voltage so as to enable a memory operation to be performed.

Figure 6B:
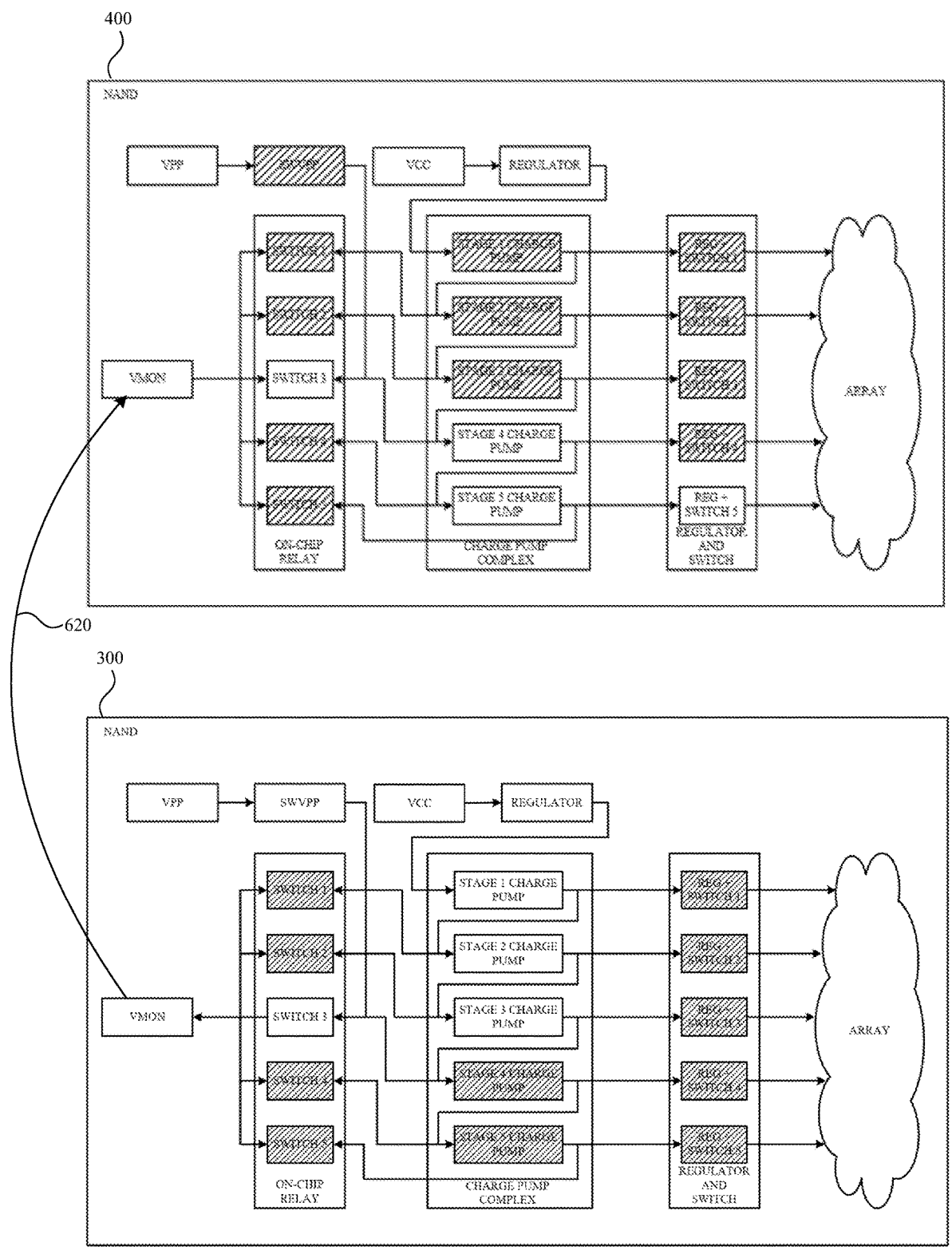
FIG. 6B illustrates a bond wire electrically coupling a voltage input/output pad of a functional NAND die to a voltage input/output pad of a failing NAND die according to an example.

FIG. 6B illustrates a bond wire (represented by the arrow 620) or other coupling mechanism electrically coupling a voltage input/output pad of a functional NAND die (e.g., functional NAND die 300 (FIG. 3B)) to a voltage input/output pad of the failing NAND die (e.g., failing NAND die 400 (FIG. 4B)). As discussed above with respect to FIG. 3B and FIG. 4B, a voltage generated by the stage 1 charge pump, the stage 2 charge pump and the stage 3 charge pump of the pump complex of the functional NAND die 300 may be provided as an input to the voltage input/output pad of the failing NAND die 400.

In this example, the voltage is provided from the functional NAND die 300 to the failing NAND die 400 in response to a defect detected in a charge pump (e.g., the stage 2 charge pump) of the failing NAND die 400. As explained above, upon receiving the voltage from the functional NAND die 300, switch 3 from an on-chip relay may be activated and used to provide the received voltage to a functional charge pump (e.g., the stage 4 charge pump and/or the stage 5 charge pump) in the charge pump complex of the failing NAND die 400. The functional charge pumps on the failing NAND die 400 may increase the voltage so as to enable a memory operation to be performed such as previously described.

Figure 6C:
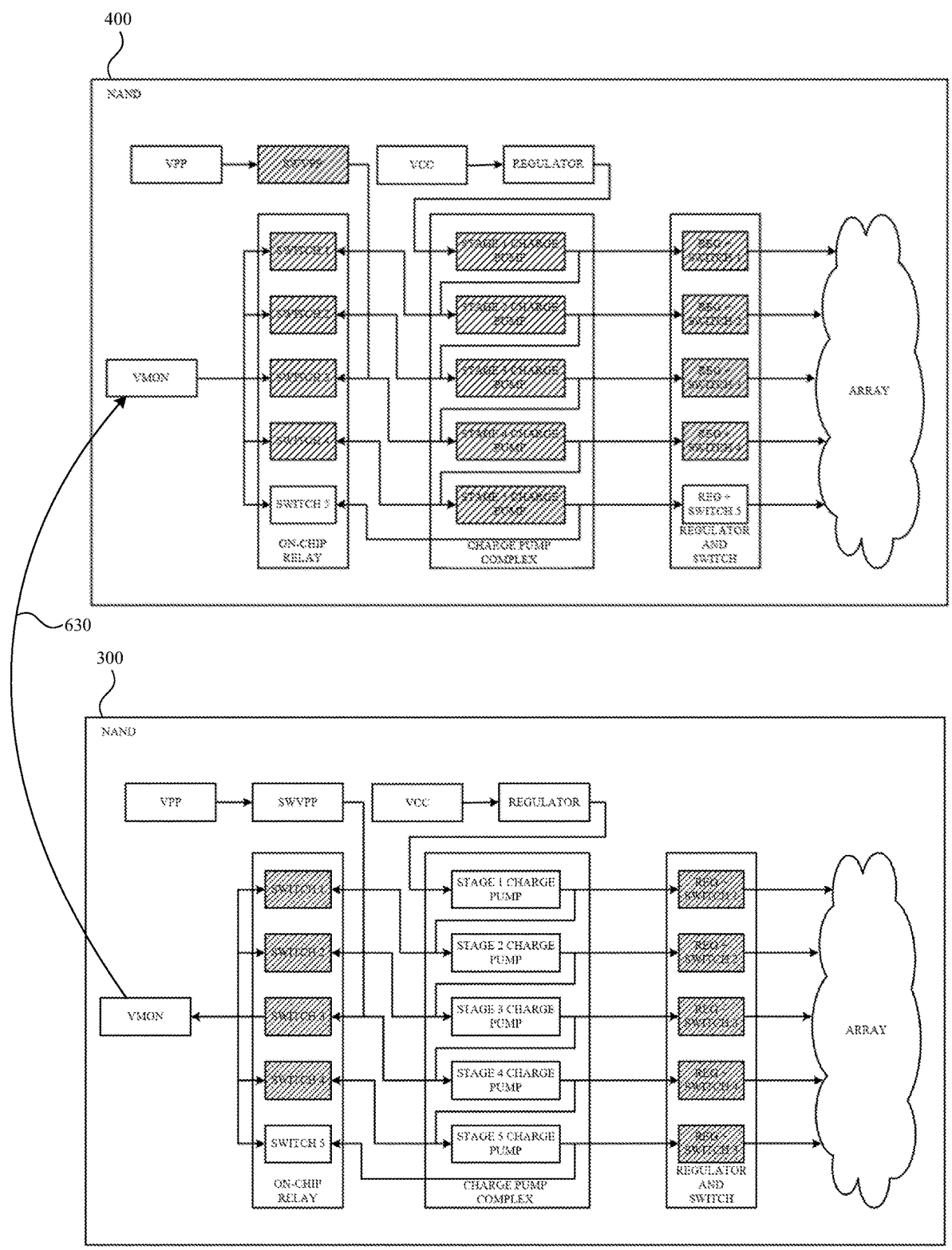
FIG. 6C illustrates a bond wire electrically coupling a voltage input/output pad of a functional NAND die to a voltage input/output pad of a failing NAND die according to an example.

FIG. 6C illustrates a bond wire (represented by the arrow 630) or other coupling mechanism electrically coupling a voltage input/output pad of a functional NAND die (e.g., functional NAND die 300 (FIG. 3A)) to a voltage input/output pad of the failing NAND die (e.g., failing NAND die 400 (FIG. 4A)). As discussed above with respect to FIG. 3A and FIG. 4A, a voltage generated by the stage 1 charge pump through the stage 5 charge pump of the pump complex of the functional NAND die 300 may be provided as input to the voltage input/output pad of the failing NAND die 400.

In this example, the voltage is provided from the functional NAND die 300 to the failing NAND die 400 in response to a defect detected in a charge pump (e.g., the stage 4 charge pump) of the failing NAND die 400. As explained above, upon receiving the voltage from the functional NAND die 300, the switch 5 from the on-chip relay of the failing NAND die 400 may be activated and provide the received voltage to a regulator and switch 5 of a regulator and switch complex of the failing NAND die 400. The voltage may then be provided to the array so as to enable a memory operation to be performed such as previously described.

Figure 6D:
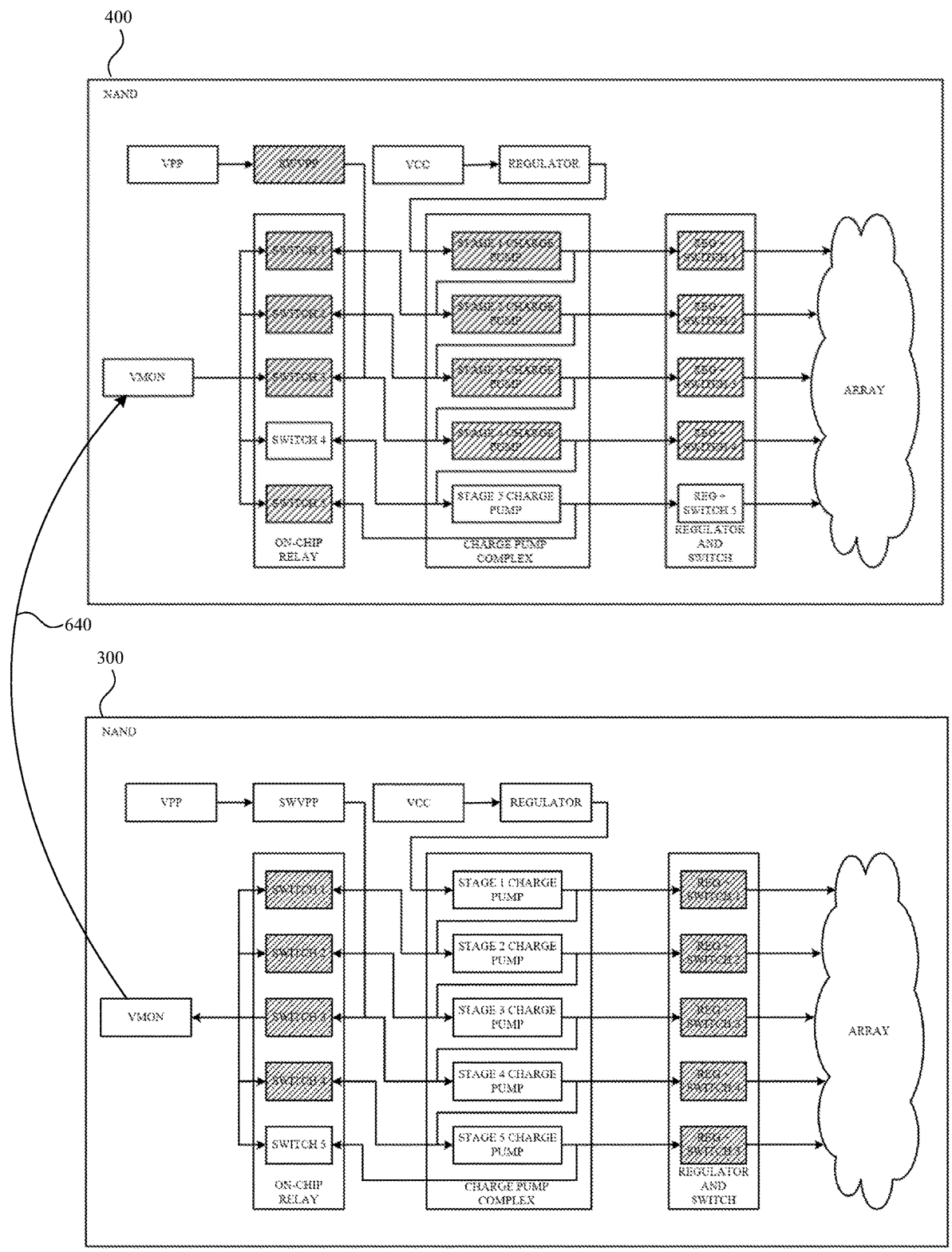
FIG. 6D illustrates a bond wire electrically coupling a voltage input/output pad of a functional NAND die to a voltage input/output pad of a failing NAND die while allowing the failing NAND die to supplement the received voltage according to an example.

FIG. 6D illustrates a bond wire (represented by the arrow 640) or other coupling mechanism electrically coupling a voltage input/output pad of a functional NAND die (e.g., functional NAND die 300 (FIG. 3A)) to a voltage input/output pad of a failing NAND die (e.g., failing NAND die 400 (FIG. 4A)) while still allowing the failing NAND die to supplement the received voltage according to an example. As discussed above with respect to FIG. 3A and FIG. 4A, a voltage generated by the stage 1 charge pump through the stage 5 charge pump of the pump complex of the functional NAND die 300 may be provided as an input to the voltage input/output pad of the failing NAND die 400.

In this example, the voltage is provided from the functional NAND die 300 to the failing NAND die 400 in response to a defect detected in a charge pump (e.g., the stage 4 charge pump) of the failing NAND die 400. However, when the generated voltage is received by the failing NAND die 400, the switch 4 from the on-chip relay of the failing NAND die 400 is activated. The generated voltage is provided as an input to the stage 5 charge pump of the charge pump complex of the failing NAND die 400 which internally increases the voltage of the generated voltage. The increased voltage may then be provided to a regulator and switch 5 of a regulator and switch complex of the failing NAND die 400 and the array so as to enable a memory operation to be performed.

Although specific examples have been given, it is contemplated that any number of charge pumps on a functional NAND die may be used to generate a voltage for a failing NAND die. Likewise, it is contemplated that the voltage input pad and/or the voltage input/output pad of a functional NAND die may be electrically coupled to the voltage input pad and/or the voltage input/output pad of the failing NAND die. It is also contemplated that a voltage input pad may function in a similar manner to the voltage input/output pad. In some examples, a voltage range of any ESD structures, as well as any associated transistors, may need to be adjusted.

Further, it is contemplated that multiple functional NAND dies may be electrically coupled to a single failing NAND die. Thus, each functional NAND die may provide a generated voltage to the voltage input pad and/or the voltage input/output pad of the failing NAND die. In addition, a first functional NAND die may generate and provide a first voltage to the failing NAND die while a second functional NAND die may generate and provide a second voltage to the failing NAND die. In one example, the first voltage and the second voltage are equivalent or substantially equivalent. In another example, the first voltage and the second voltage are different.

In some examples, the first functional NAND die and the second functional NAND die may be electrically coupled to the failing NAND die via the same voltage input pad and/or the same voltage input/output pad. In another example, the first functional NAND die is coupled to the failing NAND die via the voltage input pad while the second functional NAND die is electrically coupled to the failing NAND die via the voltage input/output pad. In yet another example, each NAND die may have multiple voltage input pads and/or multiple voltage input/output pads. As such, a first NAND die may be electrically coupled to a first voltage input pad and/or a first voltage input/output pad while a second NAND die may be coupled to a second voltage input pad and/or a second voltage input/output pad. Additional configurations and shown and described in more detail with respect to FIG. 10A-FIG. 10D.

Figure 7:
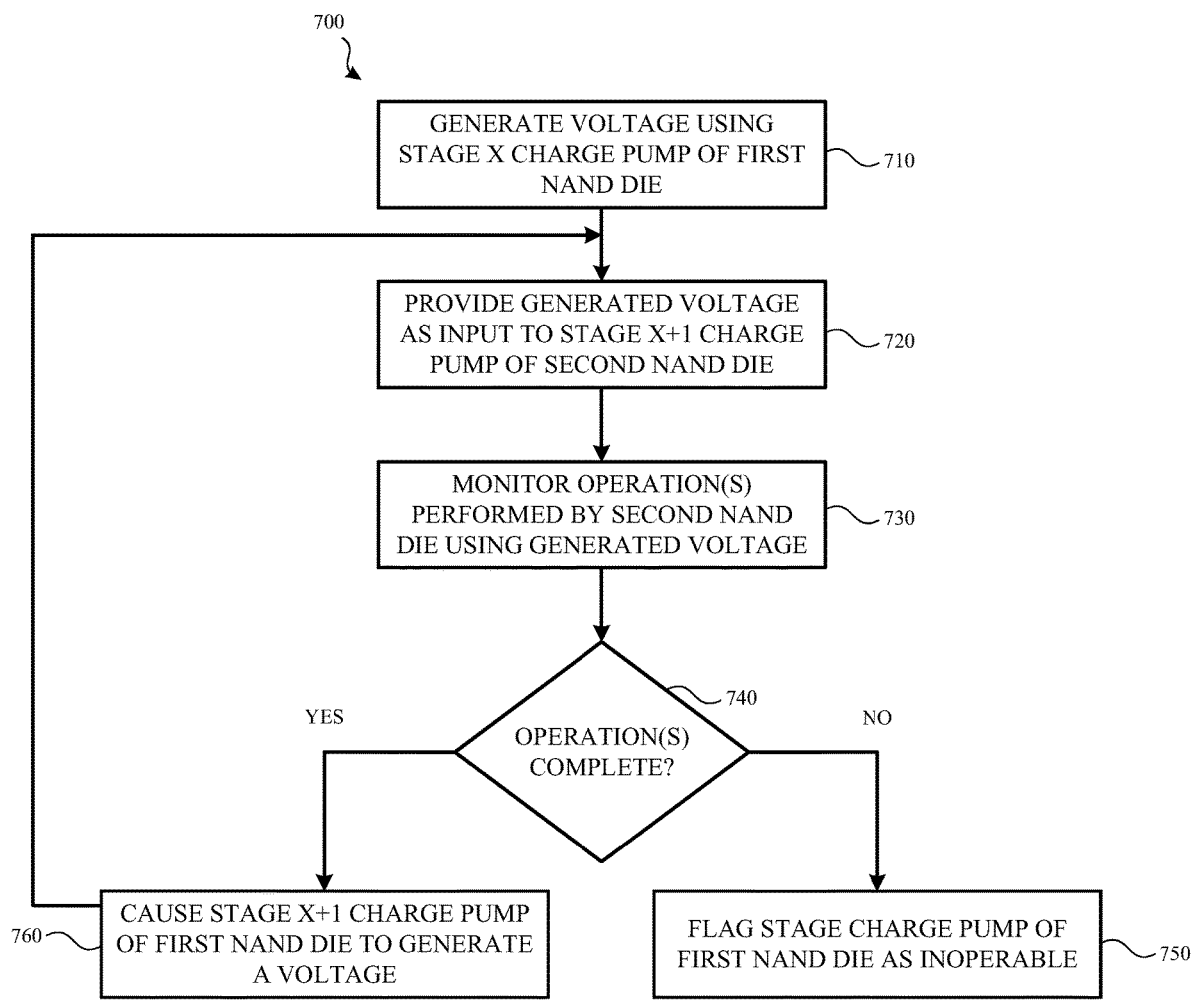
FIG. 7 illustrates a method for detecting a fault in a stage of a charge pump of charge pump complex of a memory die according to an example.

FIG. 7 illustrates a method 700 for detecting a fault in a stage of a charge pump of charge pump complex according to an example. The method 700 may be performed by a controller (e.g., controller 130 (FIG. 1)) and/or a NAND die (e.g., NAND die 200 (FIG. 2)). In some examples, the method 700 may be performed when a NAND die is failing but the system is unable to pinpoint a point of failure (e.g., which stage charge pump in the pump complex is failing). Thus, in this example, the first NAND die may be referred to as a failing NAND die while the second NAND die is referred to as a functional NAND die.

Method 700 begins when a voltage is generated (710) by a stage X charge pump in a pump complex of a first NAND die. In an example, X is equal to one. Therefore, the voltage is generated by a stage 1 charge pump of the first NAND die. However, method 700 may begin at any stage of charge pump complex.

Once the voltage is generated, the voltage is provided (720) as input to a stage X+1 charge pump of a second NAND die. Thus, the generated voltage received from the first NAND die is provided, via a switch on the second NAND die, as an input voltage to a stage 2 charge pump in the pump complex of the second NAND die. As previously discussed, the voltage may be provided to the second NAND die via a voltage input pad and/or a voltage input/output pad. For example, a bond wire may couple a voltage input pad and/or a voltage input/output pad of the first NAND die to a voltage input pad and/or a voltage input/output pad of the second NAND die.

Upon receipt of the generated voltage, the stage X+1 charge pump of the second NAND die increases the voltage and attempts to perform an operation (e.g., a memory operation). The status and/or the outcome of the operation is monitored (730) so a determination (740) may be made as to whether the operation was successfully completed.

If it is determined (740) that the operation was not completed successfully (e.g., data is corrupt or the second NAND die begins to fail), the stage X charge pump (e.g., stage 1 charge pump) of the first NAND die is flagged or otherwise identified as inoperable.

However, if it is determined (740) that the operation was successfully completed, the controller causes the stage X+1 charge pump (e.g., the stage 2 charge pump) of the first NAND die to generate (760) a voltage. The newly generated voltage is then provided (720) as input to the next stage of the charge pump (e.g., a stage 3 charge pump) on the second die. This process continues until all stages of the charge pump on the first NAND die have been tested and/or until the failed stage is identified.

In another example, fault discovery may be done by status indicators associated with each stage of a charge pump in the charge pump complex. For example, a circuit may monitor or track an output of each stage of the charge pump. Measurements and/or comparisons may subsequently be used to determine whether a particular charge pump stage is outputting a requisite voltage. In some examples, fault discovery may be initiated when a connection to an array is active or when the connection to the array is inactive. In some examples, an array connection may be responsible for an indication of a pump failure (such as described in greater detail below with respect to FIG. 9). As such, it may be beneficial to test the charge pumps of a particular NAND die when a connection to the array is inactive.

Figure 8:
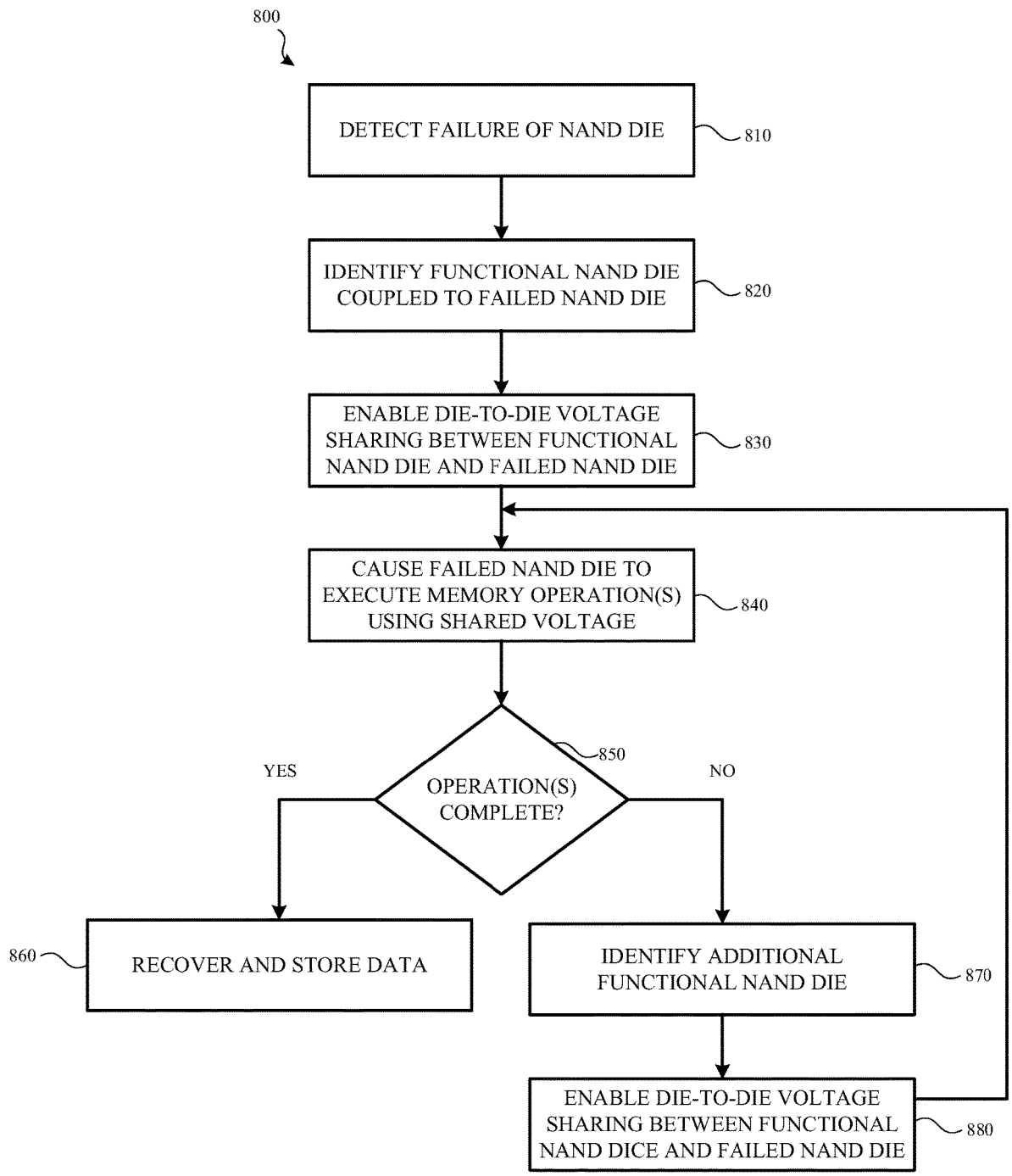
FIG. 8 illustrates a method for enabling die-to-die voltage sharing between a functional NAND die and a failed NAND die according to an example.

FIG. 8 illustrates a method 800 for enabling die-to-die voltage sharing between a functional NAND die and a failed NAND die according to an example. The method 800 may be performed by a controller (e.g., controller 130 (FIG. 1)) or other processing circuitry associated with a data storage device.

The method 800 begins when a controller detects (810) a failure of a particular NAND die. In an example, the failure of the particular NAND die may be detected or otherwise identified in a number of ways. For example, the particular NAND die may include or otherwise be associated with monitoring circuitry that tracks a voltage provided by a particular charge pump or stage of a charge pump. The monitoring circuit may output a flag or otherwise generate and/or provide a notification (e.g., to the controller) that the voltage provided by the charge pump and/or a particular stage of the charge pump is below a voltage threshold. In another example, the controller may perform the method 700 shown and described with respect to FIG. 7.

In yet another example, the controller may detect whether the particular NAND die successfully completes a requested memory operation and/or whether data associated with a requested memory operation is corrupt. For example, the controller may determine whether an erase operation or a write operation were successfully completed by the particular NAND die. If either operation was not completed, the controller may determine that the NAND die has failed (or is failing).

In some examples, different memory operations may require a different amount of voltage. For example, an erase operation may require a first voltage while a write operation may require a second, different voltage. Accordingly, the controller may also determine which memory operations have failed and which memory operations are successful and implement the die-to-die voltage sharing accordingly.

For example, a read operation may require a lower voltage when compared to a write operation. If the write operation on the particular NAND die is unsuccessful but a read operation is successful, the controller may implement the die-to-die voltage sharing process only when the particular NAND die is to perform a write operation. In another example, the controller may determine to read the data from the particular NAND die while the particular NAND die is still operational and subsequently flag the particular NAND die as inoperable. If the particular NAND die is flagged as inoperable, the controller may determine to forgo a die-to-die voltage sharing process with the particular NAND die.

In some examples, if the controller detects a failure of a NAND die, the controller may cause an array of the NAND die to be temporarily disconnected from the pump complex to help ensure that the failure is not a result of a short or other issue (e.g., issues with array connections) downstream from the charge pump complex. Once the array is disconnected, the controller may monitor the voltages provided by the various stages of the charge pump in order to identify the source of the issue.

Once a failure has been detected, the controller may also identify (820) functional NAND dies that are electrically coupled to the failed NAND die. In some examples, the controller may access a storage device that contains a map or other information that indicates which NAND dies are electrically coupled. In another example, the identification may be done on the fly. For example, when a controller determines that the particular NAND die has failed, the controller may request information from various other NAND dies (or the failed NAND die) to determine which NAND dies are electrically coupled.

The controller also enables (830) die-to-die voltage sharing between the identified functional NAND die and the failed NAND die. In an example, the controller may cause the failed NAND die to enter a voltage acceptance mode whereby the failed NAND die will accept an external voltage in place of an internally generated voltage. Likewise, the controller may cause the functional NAND die to enter a voltage output mode in which the functional NAND die generates a voltage for the failed NAND die. As explained herein, the voltage may be shared via one or more bond pads and/or a bond wire. In an example, the controller is also configured to synchronize the voltage acceptance mode and the voltage output mode so the die-to-die voltage sharing process is as efficient as possible.

When the failed NAND die receives the voltage from the functional NAND die, the controller causes (840) the failed NAND die to execute one or more memory operations. The controller monitors the one or more memory operations to determine (850) whether the one or more memory operations were successfully completed. In an example, the one or more memory operations may be a read operation such that data stored by the failed NAND die may be recovered. If it is determined that the one or more memory operations were successfully completed, the data is recovered (860) and subsequently stored in another NAND die.

However, if it is determined (850) that the one or more operations were not successfully completed, the controller may identify (870) additional functional NAND dies that are coupled to the failed NAND die. Once the additional functional NAND dies are identified, the controller enables (880) die-to-die voltage sharing between the additional functional NAND dies and the failed NAND die. In an example, each functional NAND die may provide the same or a similar voltage to the failed NAND die. In another example, each functional NAND die may provide a different voltage to the failed NAND die.

When the failed NAND die has received the voltages from the functional NAND dies, the controller causes (840) the failed NAND die to execute one or more memory operations using the shared voltage such as described above. This process may repeat until the controller determines that the data on the failed NAND die is unrecoverable and/or there are no more available functional NAND die from which to receive a voltage.

In an example, the method 800 may be performed to recover data from a failed NAND die. In another example, the method 800 may be performed over a longer period of time in order to keep the failed NAND die functional. In yet another example, the method 800 may be performed to overcome some other detected issue such as, for example, a short in a circuit, a voltage drop and the like.

For example, it is possible that the charge pumps of the failed NAND die are functional but the generated voltage is not deliverable to other parts of the NAND die (e.g., the array). In this particular example, this issue may be manifest as large portions of the array failing with the pump-fail-like signatures. In order to address the above, the controller may implement a die-to-die voltage sharing process such as previously described. The combined voltage from both NAND dies (or additional NAND dies) may be sufficient to overcome the issue (e.g., delivering the voltage to the array).

Figure 9:
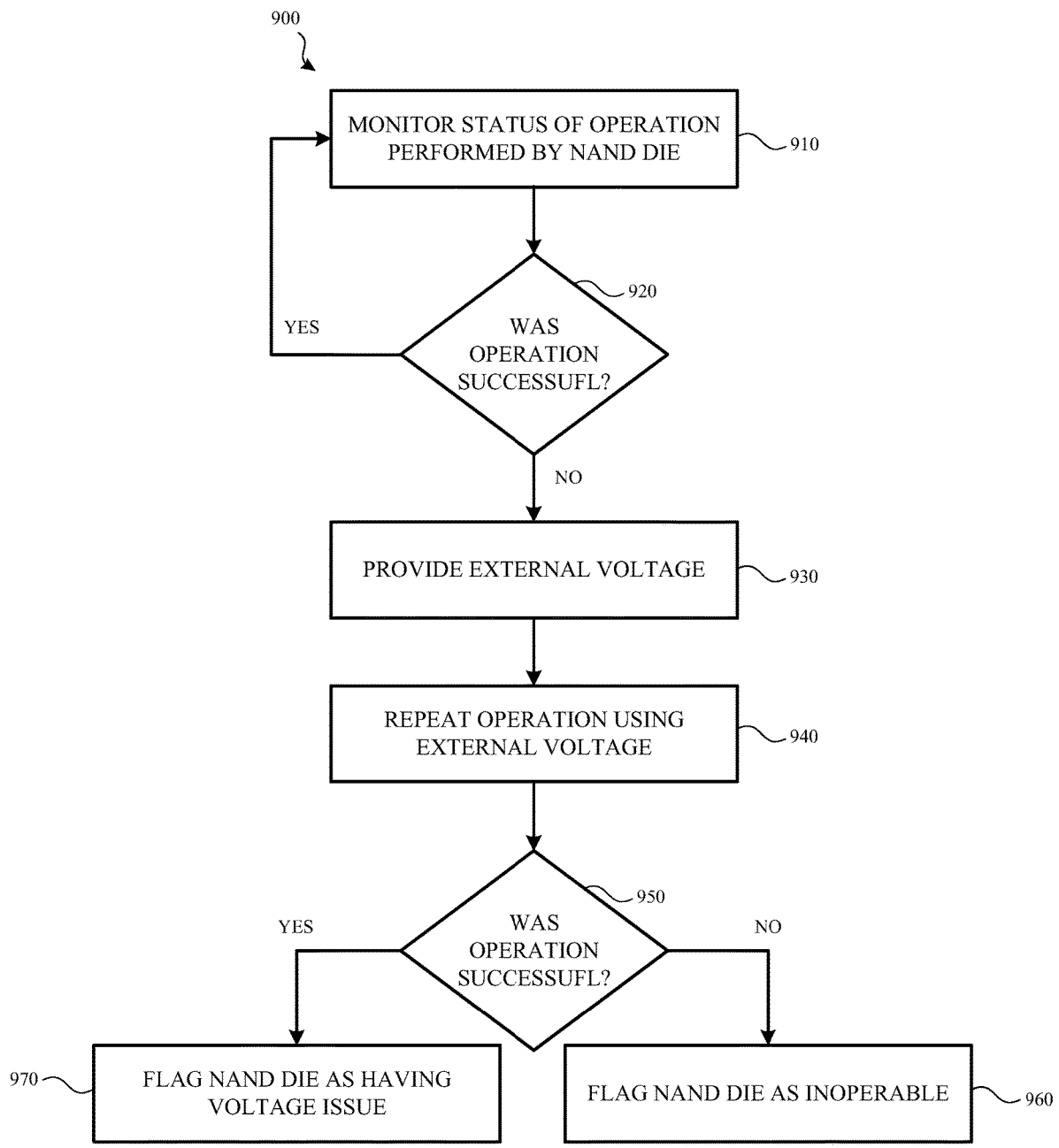
FIG. 9 illustrates a method for determining whether an external voltage should be applied to a NAND die according to an example.

FIG. 9 illustrates a method 900 for determining whether an external voltage should be applied to a NAND die according to an example. In an example, the external voltage may be supplied to a NAND die from another NAND die. In another example, the external voltage may be applied to a NAND die from the system (e.g., a voltage rail or other system-level power supply). The method 900 may be performed by a controller (e.g., controller 130 (FIG. 1)) or other processing circuitry associated with a data storage device.

The method 900 begins when a controller monitors (910) a status of an operation performed by a NAND die. The monitoring may be done periodically or continuously. In another example, the monitoring may be done in response to detected issue with a memory operation (e.g., a memory operation was not successfully completed). In an example, the operation may be a read, write or erase operation.

In response to the monitoring, the controller (or other circuitry) may determine (920) whether the memory operation was successfully performed. This determination may be made based on a status indicator associated with a requested memory operation. In another example, information from monitoring circuitry may track a voltage provided by a particular charge pump or stage of a charge pump such as described above. In another example, the controller may perform the method 700 shown and described with respect to FIG. 7.

If it is determined (920) that the memory operation was successful, the controller may continue to monitor (910) the status of other operations performed by the NAND die. However, if it is determined (920) that the operation was not successfully completed, the controller causes an external voltage to be provided (930) to the NAND die. In one example, the external voltage may be provided by another NAND die. In another example, the external voltage may be provided by a system-level power supply such as, for example, a voltage rail or other system-level power source. In some examples, the controller may cause the opening or closing of a switch that enables the NAND die to accept or otherwise receive a voltage from an external source.

When the external voltage has been provided to the NAND die, the controller causes the NAND die to repeat (940) the requested operation (e.g., repeat the failed operation) using the external voltage. The controller monitors the operation to determine (950) whether the operation was successful with the external voltage. If it is determined that the operation was successful, the controller flags (970) or otherwise identifies the NAND die as having a particular voltage issue. If it is determined (950) that the operation was not successful, the controller may flag the NAND die as inoperable. In another example, the controller may cause an additional external voltage to be provided to the NAND die prior to flagging the NAND die as inoperable.

Figure 10:
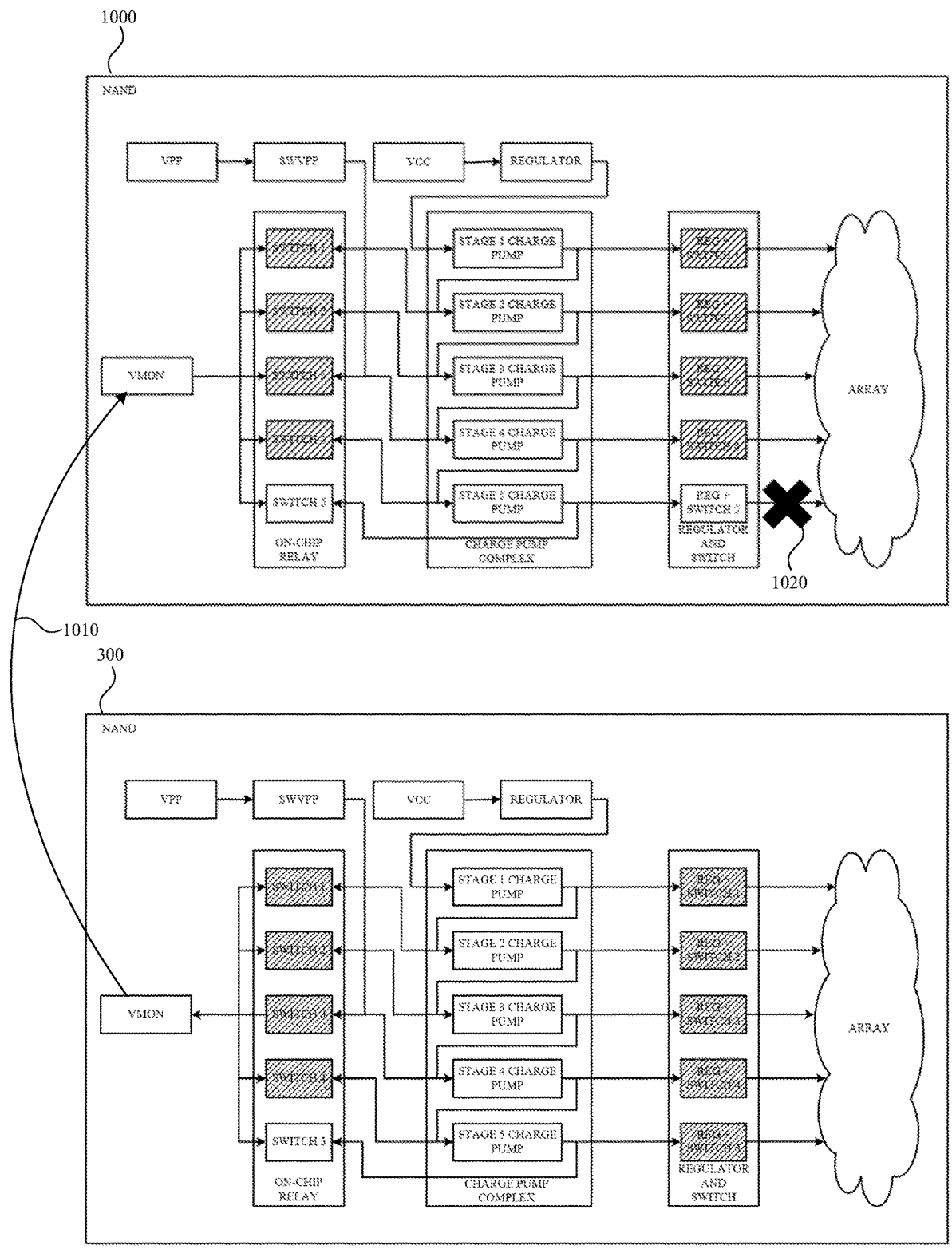
FIG. 10 illustrates a bond wire electrically coupling a voltage input/output pad of a functional NAND die to a voltage input/output pad of a failing NAND die to overcome a detected issue in the failing NAND die according to an example.

FIG. 10 illustrates a bond wire (represented by the arrow 1010) electrically coupling a voltage input/output pad of a functional NAND die (e.g., functional NAND die 300 (FIG. 3A)) to a voltage input/output pad of an failing NAND die 1000 to overcome a detected issue in the failing NAND die 1000 according to an example. The failing NAND die 1000 may be similar to the NAND die 200 shown and described with respect to FIG. 2.

In this example, the charge pump complex of the failing NAND die 1000 is operational but an issue (represented by the X 1020) is preventing the voltage generated by the pump complex from reaching the array. Accordingly, a controller (e.g., controller 130 (FIG. 1)) causes the functional NAND die 300 to generate a voltage using its charge pumps (e.g., the stage 1 charge pump through the stage 5 charge pump) and provide the generated voltage, via the bond wire 1010, to the failing NAND die 1000. In an example, the generated voltage may be provided as input to the voltage input/output pad of the failing NAND die 1000.

When the generated voltage is received by the failing NAND die 1000, the switch 5 from the on-chip relay of the failing NAND die 1000 is activated. The generated voltage is then provided to a regulator and switch 5 of a regulator and switch complex of the failing NAND die 1000.

The failing NAND die 1000 may also generate an internal voltage to supplement the received generated voltage. For example, the charge pump complex of the failing NAND die 1000 may use each charge pump stage to generate an internal voltage such as described above with respect to FIG. 2. The internally generated voltage may also be provided to the regulator and switch 5 of the regulator and switch complex of the failing NAND die 1000. The combination of the internally generated voltage and the received generated voltage may be sufficient to overcome the issue 1020 (e.g., "pop" the short) that prevented the memory operations from occurring.

Although FIG. 10 illustrates a single functional NAND die 300 providing a generated voltage to the failing NAND die 1000, any number of functional NAND dies may be electrically coupled together and used to provide a generated voltage to the failing NAND die 900. In another example, a system-level power source may be used to provide a voltage to the failing NAND die 1000.

FIG. 11A-FIG. 11D illustrate a number of different ways NAND dies may be bonded together according to an example.

Figure 11A:
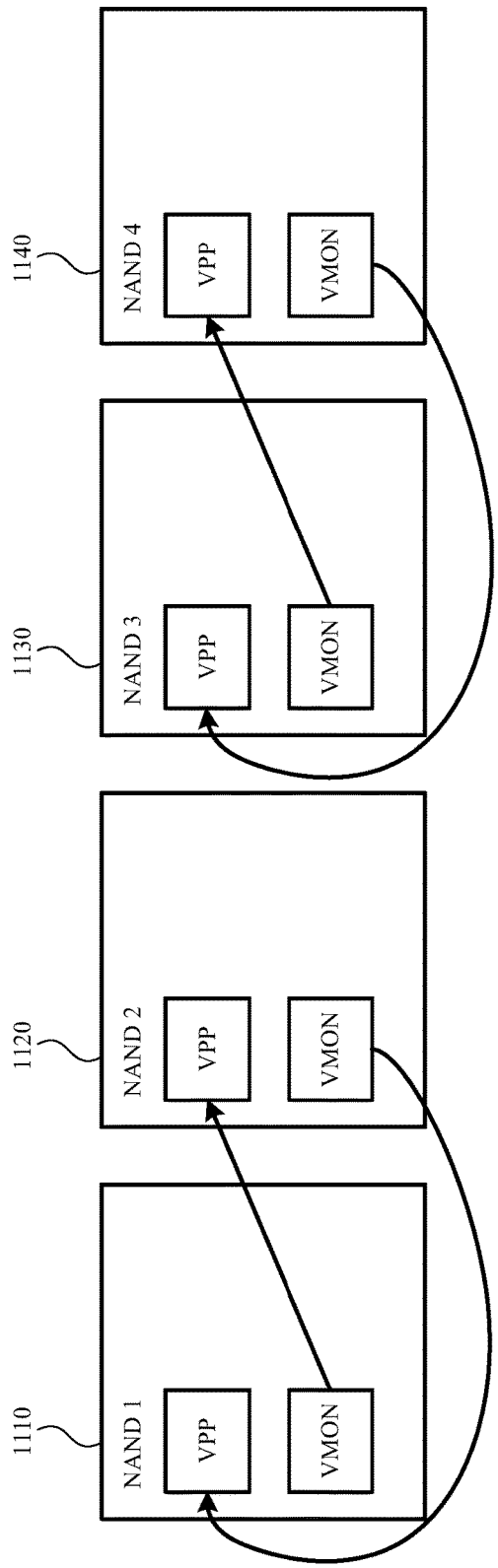
FIG. 11A illustrates a first arrangement of NAND dies that are bonded together according to an example.

In the example shown in FIG. 11A, a first NAND die supplies a voltage to a second NAND die and the second NAND die supplies voltage to the first NAND die. For example, a voltage input/output pad (e.g., VMON) of NAND 2 1120 may be electrically coupled (e.g., via a bond wire) to a voltage input pad (e.g., VPP) of NAND 1 1110. Likewise, a voltage input/output pad of NAND 1 may be electrically coupled to a voltage input pad of NAND 2 1120. The same is true for NAND 3 1130 and NAND 4 1140. In this arrangement, one NAND die may be available as a voltage source for a failed NAND die.

Figure 11B:
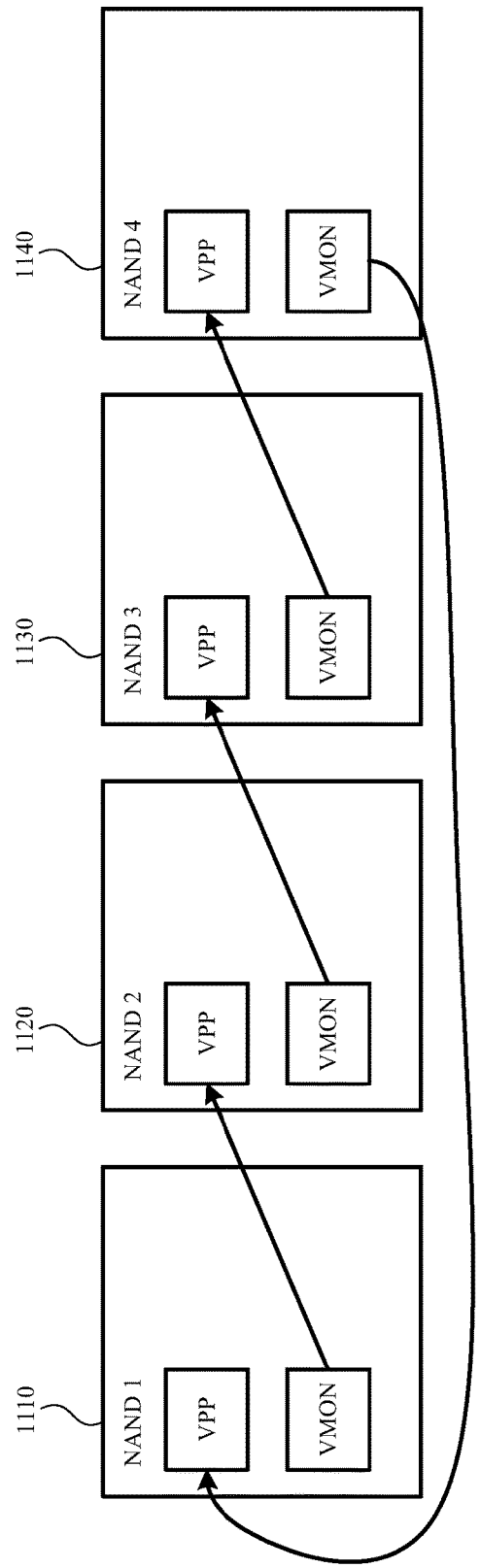
FIG. 11B illustrates a second arrangement of NAND dies that are bonded together according to an example.

In the example shown in FIG. 11B, a first NAND die supplies a voltage to a second NAND die, the second NAND die supplies a voltage to a third NAND die, the third NAND die supplies a voltage to a fourth NAND die and the fourth NAND die supplies a voltage to the first NAND die. For example, a voltage input/output pad (e.g., VMON) of NAND 1 1110 may be electrically coupled (e.g., via a bond wire) to a voltage input pad (e.g., VPP) of NAND 2 1120. Likewise, a voltage input/output pad of NAND 2 1120 may be electrically coupled to a voltage input pad of NAND 3 1130. A voltage input/output pad of NAND 3 1130 may be electrically coupled to a voltage input pad of NAND 4 1140 and the voltage input/output pad of NAND 4 1140 may be electrically coupled to a voltage input pad of NAND 1 1110. In this arrangement, one NAND die may be available as a voltage source for a failed NAND die.

In the example shown in FIG. 11C, each NAND die can share a voltage with any other NAND die. For example, a voltage input/output pad (e.g., VMON) of NAND 1 1110 may be electrically coupled (e.g., via a bond wire) to a voltage input/output pad of NAND 2 1120, NAND 3 1130 and/or NAND 4 1140. Each of the other NAND dies may be coupled to each other in a similar manner. In this example, multiple functional NAND dies may supply voltage in parallel to a failing NAND die.

In the example shown in FIG. 11D, both the voltage input/output pad (e.g., VMON) and the voltage input pad (e.g., VPP) of each NAND die may be used as an input for a voltage. For example, the voltage input/output pad of NAND 1 1110 may be electrically coupled (e.g., via a bond wire) to a voltage input pad and a voltage input/output pad of NAND 2 1120, to a voltage input pad and a voltage input/output pad of NAND 3 1130 and to a voltage input pad and a voltage input/output pad of NAND 4 1140. Each of the other NAND dies may be coupled to each other in a similar manner. As with the example shown in FIG. 11C, in this example, multiple functional NAND dies may supply voltage in parallel to a failing NAND die.

In some cases, capacitors that are external to a NAND die are prone to failure. If a capacitor were to fail, the failure would only be detected when power is actually lost. This could have a lot of system-level consequences. For example, multiple drives may power off at the same time. Accordingly, the capacitors may need to be tested while running. The tests may involve checking the current draw and/or a voltage drop and determining whether capacitance is within some valid range.

In some example, testing of capacitors may be done when a particular NAND die is not actively reliant on a voltage rail or otherwise be reliant on power from the system. In addition, it may be beneficial to execute capacitor tests during periods of low activity.

To help ensure the NAND die is not actively reliant on system-level power supplies, a switch or firmware may be used to disable or otherwise prevent the NAND die from relying (at least partially) on system-level power (e.g., power provided by a voltage rail). Accordingly, a fault determination may be executed by causing the NAND die to perform a memory operation when the voltage input/output pad is configured to accept a system-level power supply such as described above with respect to FIG. 9. If the NAND die is successful in performing the memory operation using the external power supply (and presuming the NAND die was unsuccessful in performing the operation when the switch was open), the NAND die may be identified as faulty.

The term computer-readable media as used herein may include computer storage media. Computer storage media may include volatile and nonvolatile, removable and non-removable media implemented in any method or technology for storage of information, such as computer readable instructions, data structures, or program modules. Computer storage media may include RAM, ROM, electrically erasable read-only memory (EEPROM), flash memory or other memory technology, CD-ROM, digital versatile disks (DVD) or other optical storage, magnetic cassettes, magnetic tape, magnetic disk storage or other magnetic storage devices, or any other article of manufacture which can be used to store information and which can be accessed by a computing device (e.g., computing device 110 (FIG. 1)). Any such computer storage media may be part of the computing device. Computer storage media does not include a carrier wave or other propagated or modulated data signal.

Additionally, examples described herein may be discussed in the general context of computer-executable instructions residing on some form of computer-readable storage medium, such as program modules, executed by one or more computers or other devices. By way of example, and not limitation, computer-readable storage media may comprise non-transitory computer storage media and communication media. Generally, program modules include routines, programs, objects, components, data structures, etc., that perform particular tasks or implement particular abstract data types. The functionality of the program modules may be combined or distributed as desired in various examples.

Communication media may be embodied by computer readable instructions, data structures, program modules, or other data in a modulated data signal, such as a carrier wave or other transport mechanism, and includes any information delivery media. The term "modulated data signal" may describe a signal that has one or more characteristics set or changed in such a manner as to encode information in the signal. By way of example, and not limitation, communication media may include wired media such as a wired network or direct-wired connection, and wireless media such as acoustic, radio frequency (RF), infrared, and other wireless media.

The description and illustration of one or more aspects provided in the present disclosure are not intended to limit or restrict the scope of the disclosure in any way. The aspects, examples, and details provided in this disclosure are considered sufficient to convey possession and enable others to make and use the best mode of claimed disclosure.

The claimed disclosure should not be construed as being limited to any aspect, example, or detail provided in this disclosure. Regardless of whether shown and described in combination or separately, the various features (both structural and methodological) are intended to be selectively rearranged, included or omitted to produce an embodiment with a particular set of features. Having been provided with the description and illustration of the present application, one skilled in the art may envision variations, modifications, and alternate aspects falling within the spirit of the broader aspects of the general inventive concept embodied in this application that do not depart from the broader scope of the claimed disclosure.

Aspects of the present disclosure have been described above with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks. Additionally, it is contemplated that the flowcharts and/or aspects of the flowcharts may be combined and/or performed in any order.

References to an element herein using a designation such as "first," "second," and so forth does not generally limit the quantity or order of those elements. Rather, these designations may be used as a method of distinguishing between two or more elements or instances of an element. Thus, reference to first and second elements does not mean that only two elements may be used or that the first element precedes the second element. Additionally, unless otherwise stated, a set of elements may include one or more elements.

Terminology in the form of "at least one of A, B, or C" or "A, B, C, or any combination thereof" used in the description or the claims means "A or B or C or any combination of these elements." For example, this terminology may include A, or B, or C, or A and B, or A and C, or A and B and C, or 2A, or 2B, or 2C, or 2A and B, and so on. As an additional example, "at least one of: A, B, or C" is intended to cover A, B, C, A-B, A-C, B-C, and A-B-C, as well as multiples of the same members. Likewise, "at least one of: A, B, and C" is intended to cover A, B, C, A-B, A-C, B-C, and A-B-C, as well as multiples of the same members.

Similarly, as used herein, a phrase referring to a list of items linked with "and/or" refers to any combination of the items. As an example, "A and/or B" is intended to cover A alone, B alone, or A and B together. As another example, "A, B and/or C" is intended to cover A alone, B alone, C alone, A and B together, A and C together, B and C together, or A, B, and C together.

What is claimed is:

1. A method, comprising:
   detecting failure of a charge pump on a first NAND die;
   identifying a second NAND die that is electrically coupled to the first NAND die;
   providing instructions to the second NAND die that causes the second NAND die to generate a voltage for the first NAND die;
   providing instructions to the second NAND die that causes the second NAND die to provide the voltage to the first NAND die;
   providing instructions to the first NAND die that causes the first NAND die to accept the voltage from the second NAND die; and
   causing a memory operation to be performed on the first NAND die in response to the first NAND die receiving the voltage from the second NAND die.

2. The method of claim 1, wherein the memory operation is a read operation.

3. The method of claim 1, further comprising:
   determining an outcome of the memory operation; and
   in response to the determination of the outcome of the memory operation, causing an additional voltage to be provided to the first NAND die.

4. The method of claim 3, wherein the additional voltage is provided to the first NAND die by the second NAND die.

5. The method of claim 3, wherein the additional voltage is provided to the first NAND die by a third NAND die, the third NAND die being electrically coupled to the first NAND die.

6. The method of claim 1, further comprising determining whether to cause the second NAND die to continue providing voltage to the first NAND die.

7. The method of claim 6, wherein the determination of whether to cause the second NAND die to continue providing voltage to the first NAND die is based, at least in part, on an outcome of the memory operation.

8. A storage device, comprising:
a non-volatile storage unit comprising a first memory die and a second memory die, each of the first memory die and the second memory die comprising a charge pump; and
a controller communicatively coupled to the non-volatile storage unit and configured to:
detect a failure of the charge pump on the first memory die;
cause the charge pump of the second memory die to generate a voltage for the first memory die; and
cause the second memory die to provide the generated voltage to the first memory die.

9. The storage device of claim 8, wherein the controller is further configured to cause the first memory die to accept the voltage from the second memory die.

10. The storage device of claim 8, wherein the controller is further configured to cause the first memory die to deactivate its charge pump.

11. The storage device of claim 8, wherein the controller is further configured to determine whether the generated voltage supplied by the second memory die enables the second memory die to complete a memory operation.

12. The storage device of claim 8, wherein the voltage from the second memory die supplements a voltage generated by the charge pump of the first memory die.

13. The storage device of claim 8, further comprising a third memory die, the third memory die comprising a charge pump and wherein the controller is further configured to:
cause the charge pump of the third memory die to generate a voltage for the first memory die; and
cause the third memory die to provide the generated voltage to the first memory die.

14. The storage device of claim 13, wherein the voltage generated by the charge pump of the third memory die supplements the voltage generated by the charge pump of the second memory die.

15. The storage device of claim 8, wherein the controller is further configured to determine whether to cause the second memory die to continue providing the voltage to the first memory die.

16. The storage device of claim 8, wherein the controller is further configured to determine whether to cause the charge pump of the second memory die to increase the generated voltage for the first memory die.

17. A storage device, comprising:
a non-volatile storage unit comprising a first memory die electrically coupled to a second memory die, the first memory die and the second memory die comprising means for generating a voltage;
means for detecting a voltage generating failure on the first memory die;
means for causing the voltage generating means of the second memory die to generate a voltage for the first memory die; and
means for causing the second memory die to provide the generated voltage to the first memory die.

18. The storage device of claim 17, wherein the means for detecting the failure on the first memory die is a voltage monitoring means associated with the first memory die.

19. The storage device of claim 17, wherein the failure on the first memory die is a failure of the voltage generating means of the first memory die.

20. The storage device of claim 17, further comprising means for causing the generated voltage from the second memory die to supplement a voltage generated by the voltage generating means of the first memory die.

* * * * *